United States Patent
De Gaudemaris et al.

(10) Patent No.: US 8,007,102 B2
(45) Date of Patent: Aug. 30, 2011

(54) METHOD FOR DETERMINING AN OPHTHALMIC LENS

(75) Inventors: Diane De Gaudemaris, Paris (FR); Cyril Guilloux, Paris (FR); Fabien Muradore, Paris (FR)

(73) Assignee: Essilor International (Compagnie Générale d'Optique), Charenton Cedex (FR)

( * ) Notice: Subject to any disclaimer, the term of this patent is extended or adjusted under 35 U.S.C. 154(b) by 57 days.

(21) Appl. No.: 12/442,840

(22) PCT Filed: Sep. 25, 2007

(86) PCT No.: PCT/FR2007/001562
§ 371 (c)(1),
(2), (4) Date: Mar. 25, 2009

(87) PCT Pub. No.: WO2008/037892
PCT Pub. Date: Apr. 3, 2008

(65) Prior Publication Data
US 2009/0244480 A1    Oct. 1, 2009

(30) Foreign Application Priority Data

Sep. 28, 2006 (FR) ..................... 06 08515

(51) Int. Cl.
*G02C 7/02* (2006.01)
*G02C 7/04* (2006.01)
*G02C 7/06* (2006.01)

(52) U.S. Cl. ......... 351/159; 351/177; 351/161; 351/169

(58) Field of Classification Search ................. 351/177, 351/159, 161, 164, 169, 171
See application file for complete search history.

(56) References Cited

U.S. PATENT DOCUMENTS

| | | | | |
|---|---|---|---|---|
| 6,000,798 A | * | 12/1999 | Chipman et al. | 351/176 |
| 6,682,193 B1 | * | 1/2004 | Morris et al. | 351/163 |
| 6,811,260 B2 | * | 11/2004 | Yamakaji | 351/177 |
| 6,871,955 B2 | * | 3/2005 | Yamakaji et al. | 351/169 |
| 6,923,540 B2 | * | 8/2005 | Ye et al. | 351/161 |

(Continued)

FOREIGN PATENT DOCUMENTS

DE    82 22 426    3/1983

(Continued)

OTHER PUBLICATIONS

International Search Report, PCT/FR2007/001562, Feb. 13, 2008, 2 pages.

(Continued)

*Primary Examiner* — Darryl J Collins
(74) *Attorney, Agent, or Firm* — HKH Law, LLC

(57) ABSTRACT

A method for determining an ophthalmic lens includes choosing an initial lens with a first face and a second face and defining an initial surface for the second face of the lens with a central zone of diameter $D_{ini}$ and a peripheral zone of inner diameter $D_{rac}$ greater than the diameter $D_{ini}$ of the central zone, each point of the central zone and the peripheral zone having an altitude defined with respect to an axis (Z) normal to the second face of the lens and having the centre of the central zone as its origin, the altitude of the peripheral zone being defined as the minimum of the points situated on the diameter $D_{rac}$; the peripheral zone having a maximum radius of curvature comprised between the maximum radius of curvature of the first face and the maximum radius of curvature of the central zone.

22 Claims, 22 Drawing Sheets

U.S. PATENT DOCUMENTS

| | | | |
|---|---|---|---|
| 7,036,931 B2 * | 5/2006 | Lindacher et al. | 351/161 |
| 7,044,601 B2 * | 5/2006 | Wang et al. | 351/177 |
| 2005/0122470 A1 * | 6/2005 | Perrott et al. | 351/159 |

FOREIGN PATENT DOCUMENTS

| | | |
|---|---|---|
| EP | 0 055 878 | 7/1982 |
| EP | 0 990 939 | 4/2000 |
| FR | 2 509 482 | 1/1983 |

OTHER PUBLICATIONS

English Translation of the Written Opinion of the International Searching Authority, PCT/FR2007/001562, Mar. 28, 2009, 4 pages.

* cited by examiner

METHOD FOR DETERMINING AN OPHTHALMIC LENS

CROSS-REFERENCE TO RELATED APPLICATIONS

This application is the National Stage of International Application No. PCT/FR2007/001562, filed on Sep. 25, 2007, which claims the priority to French Patent Application Ser. No. 06 08 515, filed on Sep. 28, 2006. The contents of all applications are hereby incorporated by reference in their entireties.

FIELD OF THE INVENTION

A object of the present invention is a method for determining an ophthalmic lens and an ophthalmic lens obtained by such a method.

BACKGROUND

Any ophthalmic lens intended to be held in a frame is associated to a prescription. The ophthalmic prescription can include a positive or negative power prescription as well as an astigmatism prescription. These prescriptions correspond to corrections enabling the wearer of the lenses to correct defects of his vision. A lens is fitted in the frame in accordance with the prescription and with the position of the wearer's eyes relative to the frame.

In the most simple cases, the prescription is reduced to a positive or negative power prescription. The lens is termed unifocal and has a rotational symmetry. It is simply fitted in the frame in such a way that the wearer's main direction of glance coincides with the axis of symmetry of the lens.

For long-sighted wearers, the value of the power correction is different for far vision and near vision, due to the difficulties of accommodation in near vision. The prescription thus comprises a far-vision power value and an addition (or power progression) representing the power increment between far vision and near vision; this comes down to a far-vision power prescription and a near-vision power prescription. Lenses suitable for long-sighted wearers are progressive multifocal lenses; these lenses are described for example in FR-A-2 699 294, U.S. Pat. Nos. 5,270,745 or 5,272,495, FR-A-2-683 642, FR-A-2 699 294 or also FR-A-2 704 327. Progressive multifocal ophthalmic lenses include a far-vision zone, a near-vision zone, an intermediate-vision zone, a principal progression meridian crossing these three zones. They are generally determined by optimization, based on a certain number of constraints imposed on the different characteristics of the lens. These lenses are all-purpose, in that they are suitable for wearers' differing day-to-day needs. Families of progressive multifocal lenses are defined, each lens of a family being characterized by an addition which corresponds to the power variation between the far-vision zone and the near-vision zone. More precisely, the addition, referenced A, corresponds to the power variation on the meridian between a point VL of the far-vision zone and a point VP of the near-vision zone, which are respectively called far-vision reference point and near-vision reference point, and which represent the points of intersection of the glance and the surface of the lens for far distance vision and for reading vision.

Conventionally, a lens can be defined by its base (or far-vision mean sphere) and by a power addition in the case of a multifocal lens. Starting from semi-finished lenses, only one face of which is formed with a given addition/base pair, it is possible to prepare lenses adapted to each wearer, by simple machining of a prescription face which is generally spherical or toric.

For any ophthalmic lens, the laws of the optics of ray tracings imply that optical defects appear when the light rays deviate from the central axis of any lens. These known defects which comprise inter alia a curvature defect or a power defect and an astigmatism defect can be called, in a generic way, obliquity defects of rays. A person skilled in the art knows how to compensate for these defects. For example, EP-A-0 990 939 proposes a method for determining, by optimization, an ophthalmic lens for a wearer having an astigmatism prescription. Obliquity defects have also been identified for progressive multifocal lenses. For example, WO-A-98 12590 describes a method for determining, by optimization, a set of multifocal ophthalmic lenses.

An ophthalmic lens comprises an optically useful central zone which can extend over the whole of the lens. Optically useful zone means a zone in which the curvature and astigmatism defects have been minimized to allow a visual comfort that is satisfactory for the wearer. On a progressive lens, the optically useful central zone will cover the far-vision zone, the near-vision zone and the progression zone.

Generally, the optically useful zone covers the whole of the lens which has a diameter of limited value. However, in some cases, a peripheral zone is provided on the periphery of the ophthalmic lens. This zone is termed peripheral because it does not meet the conditions of prescribed optical correction and has significant obliquity defects. The optical defects of the peripheral zone are not harmful to the wearer's visual comfort because this zone is situated outside of the wearer's field of view. A connection thus has to be provided between the optically useful central zone and the peripheral zone.

There are mainly two situations in which an ophthalmic lens will have such a peripheral zone. On the one hand, when the lens has a significant diameter which can be required by the shape of the frame, for example an elongated frame with a high curving contour, and on the other hand, when the power prescription is high, the lens thus having a significant edge or centre thickness which is desired to be reduced.

In the case of an ophthalmic lens intended to be fitted in a frame with curved contour, by 15° for example, the glass has a spherical or toric face with a high curvature (or base), between 6 diopters and 10 diopters, and a face calculated specifically to achieve the optimum correction of ametropia for the wearer in the optical centre and in the field of view. For example, for the same front face, having the same curvature, the rear face is machined to ensure the correction according to the ametropia of each wearer. The high curvature of the front face leads to a great thickness of the glass on the edges in the case of a negative lens or a great thickness of the glass in the centre in the case of a positive lens. These great thicknesses increase the weight of the lenses, which is detrimental to the wearer's comfort and makes the lenses unsightly. Moreover, for some frames, the edge thickness has to be limited to allow the glass to be fitted into the frame.

For negative lenses, the edge thicknesses can be reduced by planing with a manual facet. A thinning of the lens can also be controlled by optical optimization. An aspherization or an atorization can be calculated, at least for one of the faces of the lens, taking into account under the wearing conditions of the lens compared with a lens of the same prescription with a low curvature, in order to reduce the centre and edge thicknesses of the lens with a high curvature. Such solutions for optical aspherization or atorization are described for example in U.S. Pat. Nos. 6,698,884, 6,454,408, 6,334,681, 6,364,481 or also WO-A-97 35224.

In addition, in the case of a strong prescription lens, the cut-out lens has a significant edge thickness, on the nasal side for a hypermetropic positive lens and on the temporal side for a myopic negative lens. These extra thicknesses of the edges make it more complicated to fit the lens in the frame and make wearing the ophthalmic lenses heavier.

FR-A-2 638 246 proposes an ophthalmic lens with a high positive power and a reduced centre thickness. The lens described in this document has connecting zone between an optically useful central zone and a peripheral zone. This connecting zone is situated on the front face with a high curvature and has a rotational symmetry; the connection is obtained directly by moulding the front face.

EP-A-0 371 460 proposes an ophthalmic lens with a high power with a front face with rotational symmetry having a radius of curvature that increases over the periphery of the lens in order to reduce the edge thicknesses.

U.S. Pat. No. 6,176,577 proposes an ophthalmic lens for hypermetropia having a face with rotational symmetry having an optically useful central zone and a peripheral zone with reduced thickness. The connection between the central zone and the peripheral zone is obtained directly by moulding.

SUMMARY

The solutions of the prior art propose reducing the thickness of the edge and/or centre of the lenses of ophthalmic lenses with rotational symmetry by aspherizing or atorizing one face of the lens, generally the prescription face. The solutions proposed in the prior art do not apply to all types of lens and in particular cannot be applied in the case of multifocal ophthalmic lenses. Indeed, the solutions proposed in the prior art have a connection with rotational symmetry between the optically useful central zone and the thinned peripheral zone.

Moreover, there is still a need for a lens that better satisfies wearers with optimum optical performances while having a reduced thickness to improve the aesthetic appearance of the lens and the wearer's comfort.

To this end, the invention proposes an ophthalmic lens with a first face (for example the front face) with a given maximum radius of curvature and a second, complex face (for example the rear face) having an optically useful central zone which ensures the correction prescribed for the wearer, a peripheral zone and a connecting zone between the central and peripheral zones. The maximum radius of curvature of the peripheral zone is comprised between the maximum radius of curvature of the first face and the maximum radius of curvature of the central zone of the second face; it is chosen to optimize the thinning of the lens. An interpolation function is chosen and applied to the central and peripheral zones of this second face to define a connecting zone between the central zone and the peripheral zone. The interpolated surface is calculated under the wearing conditions in order to minimize a merit function according to the relative altitude of the peripheral zone with respect to the central zone. The invention thus allows a lens to be obtained with a reduced thickness, by virtue of the constraint imposed on the peripheral zone, and an improved comfort for the wearer by an optimization of the relative spatial positioning of the central and peripheral zones of the interpolated surface of the second face. The second face can be machined just once by a direct machining technique.

The invention consequently proposes a method for determining an ophthalmic lens comprising the steps of:
choosing an initial lens with a first face and a second face;
defining an initial surface for the second face of the lens with a central zone of diameter $D_{ini}$ and a peripheral zone of inner diameter $D_{rac}$ greater than the diameter $D_{ini}$ of the central zone, each point of the central zone and the peripheral zone having an altitude defined with respect to an axis normal to the second face of the lens and having the centre of the central zone as its origin, the altitude of the peripheral zone being defined as the minimum of the points situated on the diameter $D_{rac}$;
the peripheral zone having a maximum radius of curvature comprised between the maximum radius of curvature of the first face and the maximum radius of curvature of the central zone;
choosing an interpolation formula;
defining a current lens equal to the initial lens;
optimizing the current lens by applying
target values for power and astigmatism for given direction of glance in the central zone of the second face of the lens;
the interpolation formula to the central and peripheral zones to define an interpolated surface comprising a connecting zone, the interpolated surface minimizing a merit function for different relative altitudes of the peripheral zone with respect to the central zone.

According to the embodiments, the method for determining an ophthalmic lens according to the invention can comprise one or more of the following features:
the optimization of the central zone of the current lens is carried out under the wearing conditions;
the merit function is a minimization of the sphere and cylinder root mean square deviations calculated over a set of points between the interpolated surface and the initial surfaces of the central and peripheral zones;
the set of points for which a minimization of the sphere and cylinder root mean square deviations is calculated consists in the vertical and horizontal axes of the lens;
the set of points for which a minimization of the sphere and cylinder root mean square deviations is calculated consists in the circles of diameter $D_{ini}$ and $D_{rac}$ respectively delimiting the central and peripheral zones;
the merit function is a minimization of the maximum cylinder value in the connecting zone;
the merit function is a minimization of the norm of the sphere or cylinder gradient in the connecting zone;
the central, connecting and peripheral zones are centred on the same point of the surface of the second face of the lens, said centring point marking the primary direction of glance under the wearing conditions;
the first face of the lens is chosen as complex;
the first face and the peripheral zone of the second face of the lens are chosen as spherical;
the first face and the peripheral zone of the second face of the lens are chosen as toric;
the central zone of the second face is chosen with a power variation;
the central zone and the peripheral zone of the second face are chosen with a power variation;
the diameter of the central zone is chosen to be greater than or equal to 30 mm and less than by at least 10 mm of the total diameter of the lens before trimming;
the inner diameter of the peripheral zone is chosen to be greater than or equal by at least 10 mm of the diameter of the central zone and smaller than the total diameter of the lens before trimming.

According to one embodiment, the merit function of the minimization of the vertical and horizontal sphere and cylinder root mean square deviations between the interpolated surface and the surfaces of the central and peripheral zones is defined as:

$$FM = a\,FM\_X + b\,FM\_Y;$$

With a and b being weighting coefficients; and with $$FM\_X = \sqrt{\frac{\sum_{i=1}^{n}(Sph\_xi - Sph'\_xi)^2}{n}} + \sqrt{\frac{\sum_{i=1}^{n}(Cyl\_xi - Cyl'\_xi)^2}{n}}$$

$$FM\_Y = \sqrt{\frac{\sum_{i=1}^{n}(Sph\_yi - Sph'\_yi)^2}{n}} + \sqrt{\frac{\sum_{i=1}^{n}(Cyl\_yi - Cyl'\_yi)^2}{n}}$$

Where Sph_xi and Sph_yi are the initial sphere values at a considered point in the central zone or in the peripheral zone on the X axis and on the Y axis;

Where Cyl_xi and Cyl_yi are the initial cylinder values at a considered point in the central zone or in the peripheral zone on the X axis and on the Y axis; and Where Sph'_xi, Sph'_yi and Cyl'_xi, Cyl'_yi are the sphere and cylinder values at a considered point of the interpolated surface in the connecting zone on the X axis and on the Y axis.

The invention also relates to a lens obtained according to the method of the invention, having a negative power prescription greater than or equal to −4 diopters for far vision, or a positive power prescription greater than or equal to +3 diopters for far vision.

The invention also relates to a lens obtained according to the method of the invention, having a curvature greater than or equal to 6 diopters.

The invention equally relates to a visual device comprising at least one lens obtained according to the invention.

BRIEF DESCRIPTION OF THE DRAWINGS

Other advantages and characteristics of the invention will become apparent on reading the description which follows of the embodiments of the invention, given by way of example and with reference to the drawings which show, in.

DETAILED DESCRIPTION

In a manner known per se, on all points of a surface, a mean sphere D is defined, given by the formula:

$$D = \frac{n-1}{2}\left(\frac{1}{R_1} + \frac{1}{R_2}\right)$$

where $R_1$ and $R_2$ are the maximum and minimum radii of curvature expressed in meters, and n is the index of the material constituting the lens.

A cylinder C is also defined, given by the formula:

$$C = (n-1)\left|\frac{1}{R_1} - \frac{1}{R_2}\right|$$

The characteristics of the complex face of the lens can be expressed by means of the mean sphere and the cylinder. A lens can also be defined, given by optical characteristics, namely a power and an astigmatism, under the wearing conditions.

Figure 43:
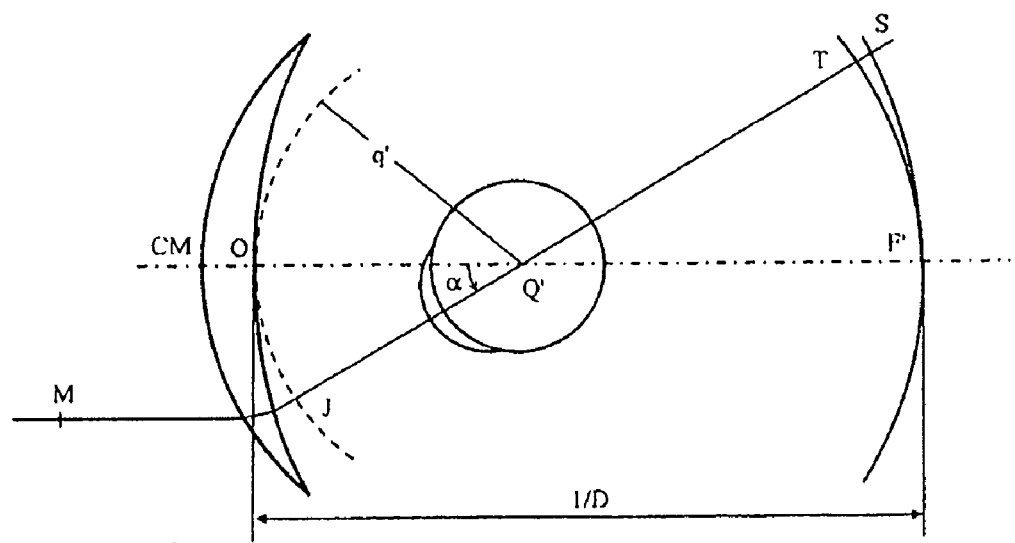
FIG. 43, a diagram of an eye-lens optical system, in vertical section.
Figure 44:
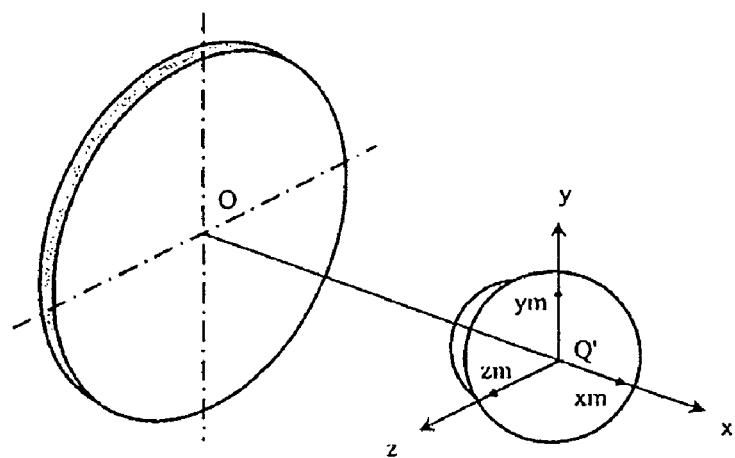
FIGS. 44 and 45, perspective diagrams of an eye-lens system.
Figure 45:
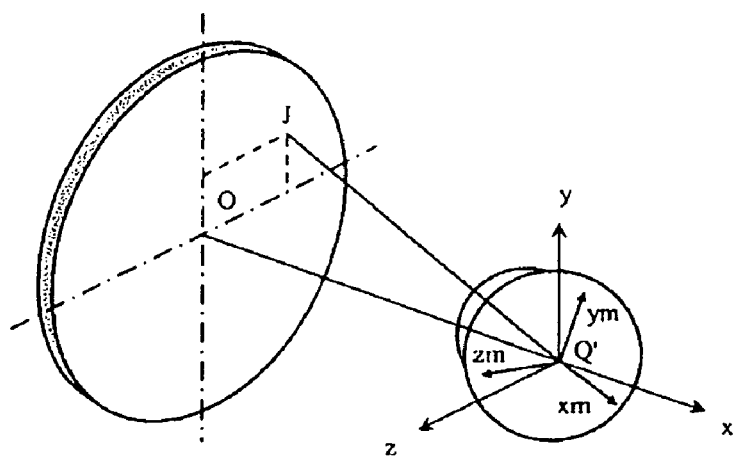

For a given lens, the corresponding optical quantities, namely a power and an astigmatism, are defined under the wearing conditions. FIG. 43 shows a diagram of an eye and lens optical system seen from above, and shows the definitions used hereinafter in the description. The centre of rotation of the eye is termed Q'; the axis Q'F' represented in the figure in dot-and-dash lines is the horizontal axis passing through the centre of rotation of the eye and extending in front of the wearer—in other words, the axis Q'F' corresponds to the primary direction of glance. This axis bisects a point on the front face of the lens called Fitting Cross, which is marked on the lenses to allow them to be positioned by an optician; this fitting cross CM makes it possible to mark the primary direction of glance on the lens under the wearing conditions. Namely, point O, the point of intersection of the rear face and this axis Q'F'. A sphere of the vertices, centre Q', and radius q', which bisects the rear face of the lens at point is defined. By way of example, a value of the radius q' of 27 mm corresponds to a standard value and gives satisfactory results during wearing of the lenses. It is possible to draw the cross section of the lens in the plane (O, x, y) defined with reference to FIG. 44. The tangent to this curve at point O is inclined with respect to the axis (O, y) by an angle termed the pantoscopic angle. The cross section of the lens can also be drawn in the plane (O, x, z). The tangent to this curve at the point O is inclined with respect to the axis (O, z) of a angle called the curving contour angle.

A given direction of glance—represented by continuous lines in FIG. 43—corresponds to a position of the eye in rotation about Q' and to a point J on the sphere of the vertices; a direction of glance can also be marked, in spherical coordinates, by two angles α and β. The angle α is the angle formed between the axis Q'F' and the projection of the straight line Q'J over the vertical plane containing the axis Q'F'; this angle appears in the diagram of FIG. 43. The angle β is the angle formed between the axis Q'F' and the projection of the straight line Q'J over the horizontal plane containing the axis Q'F'. A given direction of glance therefore corresponds to a point J of the sphere of the vertices or to a pair (α, β).

In a given direction of glance, the image of a point M in the object space situated at a given object distance, forms between two points S and T corresponding to minimum and maximum distances JS and JT (which would be sagittal and tangential focal lengths in the case of revolution surfaces, and a point M at infinity).

Using these elements, a power and an astigmatism can be defined in each direction of glance. For a direction of glance (α, β), an object point M at a given object distance by the ergorama is considered. The points S and T between which the image of the object forms are determined. The image proximity IP is then given by:

$$PI = \frac{1}{2}\left(\frac{1}{JT} + \frac{1}{JS}\right)$$

while the object proximity PO is the inverse of the distance between the point M and the point J of the sphere of the vertices. The power is defined as the sum of the object and image proximities, i.e.

$$P = PO + PI = \frac{1}{MJ} + \frac{1}{2}\left(\frac{1}{JT} + \frac{1}{JS}\right)$$

The amplitude of the astigmatism is given by $$A = \left|\frac{1}{JT} - \frac{1}{JS}\right|$$

The power and the astigmatism can be measured experimentally on the lens using a frontofocometer; they can also be calculated by ray tracing under the wearing conditions.

The invention proposes an ophthalmic lens which has centre and edge thicknesses that are reduced compared with a standard lens of the same prescription having an identical curvature. The thinning of the lens according to the invention is calculated under the wearing conditions by a method of optimizing a connecting zone between an optically useful central zone of the lens and a peripheral zone. The lens obtained in this way is lighter and more aesthetic while retaining the optical characteristics in the wearer's field of view of a lens for the same prescription that has not been thinned.

The lens of the invention has a first face which can be spherical, toric or complex. The other face of the lens according to the invention is complex; it is calculated to adapt the lens to the user's ametropia and to optimize the lens under the wearing conditions by imposing a thinning of the centre and edge thicknesses of the lens glass. In the case of a progressive multifocal lens, a single complex surface will preferably be produced on one of the faces of the lens in order to produce the power variation and the connecting zone by directly machining a single face. It is nevertheless possible to produce a complex surface on each of the faces of the lens.

Figure 1:
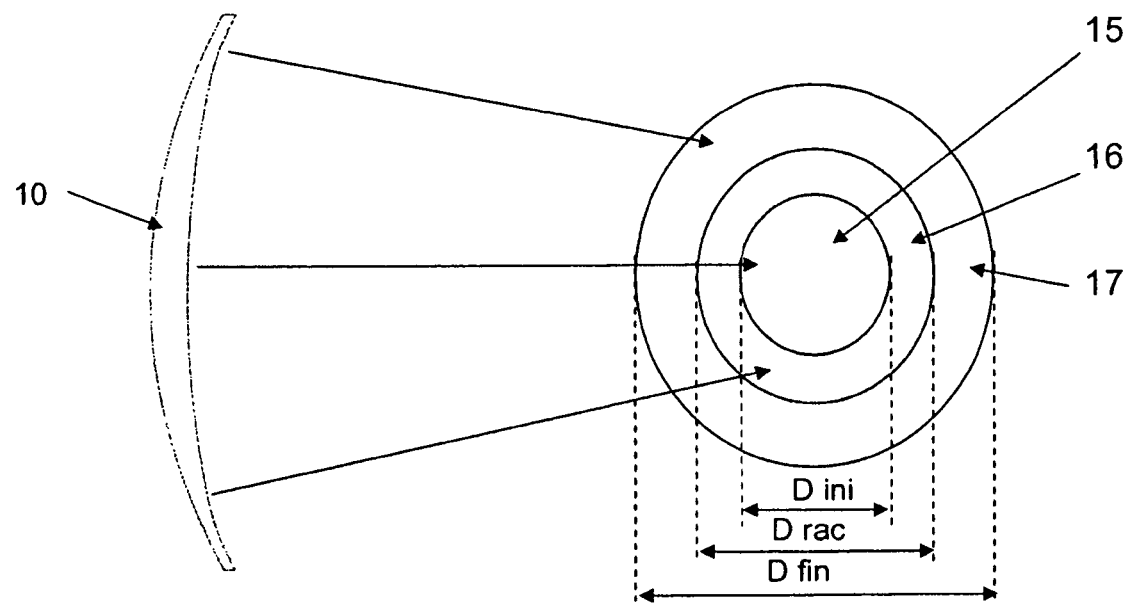
FIG. 1, a diagrammatic view of the rear face of a lens according to the invention.
Figure 2:
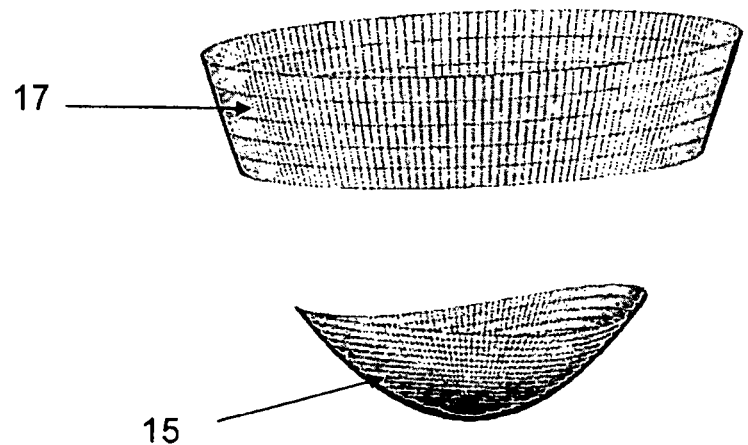
FIG. 2, a diagrammatic view of the modelling of the central zone and the peripheral zone of the lens according to the invention.

In the description of FIGS. 1 and 2, a spherical or toric front face opposite the wearer of the glasses and having a maximum radius of curvature, and a complex rear face having three zones, to be described in detail below, will be considered. It is understood that the roles of the front and rear faces can be reversed or that the complex surface can be distributed over the two faces of the lens.

FIG. 1 shows a diagram of a lens 10 according to the invention. The rear face is composed of three zones; an optically useful central zone 15 ensuring the correction necessary for the wearer in his field of view; a peripheral zone 17 having a different radius of curvature to the central zone to ensure the thinning of the edge of the lens; and a connecting zone 16 linking the central and peripheral zones. The central zone 15 can comprise a correction of power and/or astigmatism and/or it can be degressive. The surface of this complex rear face is continuous from a mathematic point of view and is machined just once by direct machining. The connecting zone 16 allows this mathematic continuity and ensures that the optical characteristics of the central zone 15 are not modified by the mechanical constraints imposed on the peripheral zone.

The three zones 15, 16 and 17 of the rear face are centred on the same point, preferably on the fitting cross which corresponds to the primary direction of glance of the wearer under the wearing conditions. The three zones 15, 16 and 17 of the rear face of the lens have an identical shape, this shape (circular, elliptical, or other) being chosen according to the frame and/or the prescription. The dimensions of each zone are variable and depend on the frame and the prescription. The central zone 15 has to have a dimension large enough to ensure a wide optical field for the wearer and the connecting zone 16 has to be wide enough to limit the visibility of the transition and narrow enough for the peripheral zone 17 to be wide enough to allow a sufficient thinning of the thickness of the lens. In this context, the diameter $D_{ini}$ of the initial central zone 15 before connection and the outer diameter $D_{fin}$ of the peripheral zone 17 which corresponds to the total diameter of the lens before trimming are considered. The connecting zone 16 thus extends between an inner diameter equal to the diameter of the central zone $D_{ini}$ and an outer diameter denoted $D_{rac}$ which corresponds to the inner diameter of the peripheral zone 17.

It can be considered that the central zone 15 will be large enough to ensure a wide optical correction field for the wearer if the diameter of the central zone of the lens $D_{ini}$ before trimming is greater than 30 mm and less than $D_{fin}$ by at least 10 mm ($30 \leq D_{ini} \leq D_{fin} - 10$). Similarly, it can be considered that the extent of the connecting zone is optimum when it is greater than the diameter of the central zone by at least 10 mm. In addition, the outer diameter of the connecting zone has to remain smaller than $D_{fin}$ to guarantee the presence of a peripheral zone ($D_{ini} + 10 \leq D_{rac} < D_{fin}$).

The surfaces constituting the central zone 15 and peripheral zone 17 are known because they are imposed by the constraints of framing and/or prescription. These surfaces of the central zone 15 and peripheral zone 17 are then sampled, as illustrated in FIG. 2. Their coordinates are in fact known in a frame (X, Y, Z) linked to the rear face of the lens. By convention, the X axis extends horizontally and the Y axis extends vertically when the lens is considered under the wearing conditions. The Z axis is normal to the rear face of the lens. On the central zone 15 and peripheral zone 17, the altitude Z is known at each point (X, Y) of the surface. By convention, the origin of the Z axis can be fixed at the centre of the central zone 15. In this context, the altitude of the peripheral zone can be defined as the Z value at the lowest point in this zone, i.e. the minimum in terms of Z of the points situated on the circle of diameter $D_{rac}$ delimiting the peripheral zone 17 towards the inside of the lens.

An interpolation formula thus calculates the altitudes Z of the points situated in the connecting zone 16 to define an interpolated surface which minimizes a merit function assessed for different relative altitudes of the peripheral zone compared with the central zone. The peripheral zone is therefore displaced in terms of Z until the interpolated surface which gives the smallest merit function is obtained. The Z-displacement of the peripheral zone does not alter the initial curvature characteristics of the central zone of the interpolated surface. The interpolated surface of the rear face can be calculated, for example, by a global spline interpolation method, as implemented in a MATLAB function (according to: de Boor, C., A Practical Guide to Splines, Springer-Verlag, 1978) or by a local polynomial interpolation method.

The peripheral zone 17 can be a spherical or toric surface, according to the geometry of the front face, or a complex surface. In the case of a spherical peripheral surface, the radius of curvature of the peripheral zone can be equal to the base of the front face; the lens is then flat in the peripheral zone. In the case of a toric peripheral surface, the meridian of largest curvature can be chosen equal to the base of the front face; the curvature value of the second meridian and the axis are chosen according to the lens prescription. The peripheral zone 17 can also be a complex surface having a power variation. In particular, in the case of a central zone having a power variation, the peripheral zone can be of the same type, i.e. progressive or degressive, with a maximum radius of curvature comprised between the maximum radius of curvature of the front face and the maximum radius of curvature of the central zone.

The rear face is then calculated only when the parameters of the wearer (prescription) and the frame (curving contour, dimension) are known. The central zone 15 is aspherized or atorized thanks to an optical optimization. This aspherization/atorization can take into account under the wearing conditions such as the curving contour angle and the pantoscopic angle of the frame. Moreover, the calculation takes into account a prismatic prescription allowing the effects of the curving contour and/or the pantoscopic angle to be corrected. The central zone is optimized so that the lens, under the wearing conditions, has the same prismatic deviations at the fitting cross as for a lens of the same prescription fitted in a frame with no curving contour.

The connecting zone 16 is calculated by the interpolation formula chosen to minimize a merit function according to the relative Z-position of the peripheral zone with the central zone. The chosen merit function can be a minimization of the sphere or cylinder root mean square deviations calculated over a set of points, for example over the horizontal and vertical axes of the lens or over the circles of diameter $D_{ini}$ and $D_{rac}$, between the interpolated surface and the initial surfaces of the central and peripheral zones. The chosen merit function can also be a minimization of the cylinder value in the connecting zone 16 or a minimization of the sphere or cylinder slopes (norm of the gradient) in the connecting zone 16.

In the following examples, the interpolation formula used is a global spline interpolation method and the chosen merit function is the sum of the sphere and cylinder root mean square deviations in the two directions of the plane of the lens (X, Y), i.e. a minimization of the vertical and horizontal sphere and cylinder root mean square deviations between the interpolated surface and the initial surfaces of the central and peripheral zones.

For the examples described below and illustrated in the attached figures, the merit function used in the interpolation programme for the complex surface comprising the connecting zone 16 can be expressed as follows:

$$FM = a\, FM\_X + b\, FM\_Y;$$

With a and b being weighting coefficients; and $$FM\_X = \sqrt{\frac{\sum_{i=1}^{n}(Sph\_xi - Sph'\_xi)^2}{n}} + \sqrt{\frac{\sum_{i=1}^{n}(Cyl\_xi - Cyl'\_xi)^2}{n}}$$

$$FM\_Y = \sqrt{\frac{\sum_{i=1}^{n}(Sph\_yi - Sph'\_yi)^2}{n}} + \sqrt{\frac{\sum_{i=1}^{n}(Cyl\_yi - Cyl'\_yi)^2}{n}}$$

Where Sph_xi and Sph_yi are the initial sphere values at a considered point in the central zone or in the peripheral zone on the X axis and on the Y axis Where Cyl_xi and Cyl_yi are the initial cylinder values at a considered point in the central zone or in the peripheral zone on the X axis and on the Y axis Where Sph'_xi, Sph'_ji and Cyl'_xi, Cyl'_yi are sphere and cylinder values at a considered point of the interpolated surface in the connecting zone on the X axis and on the Y axis.

In the examples of attached figures, the initial diameter $D_{ini}$ used is 44 mm, the connection diameter $D_{rac}$ is 64 mm and the final diameter $D_{fin}$ is 80 mm.

The lens is described in the following with reference to several embodiments. According to a first embodiment, the lens has a significant curvature in order to be fitted in a frame with an elongated curved shape. Such a lens can be unifocal (FIGS. 3 to 10) or progressive multifocal (FIGS. 11 to 26). According to another embodiment, the lens has a high negative (FIGS. 27 to 34) or positive (FIGS. 35 to 42) prescription.

In each example illustrated, the thickness of the lens has been reduced according to the optimization process of the invention.

According to a first example of embodiment, FIGS. 3 to 10 show a unifocal lens with a prescription of −4 diopters with a spherical front face of base 8. The lens does not have a prism. The plane of the lens is inclined with respect to the vertical by 8° and has a curving contour of 15° for a diameter of 78 mm. The lens has an index of 1.665. A value of q' of 27 mm was considered (as defined with reference to FIG. 43) for the measurements on the lens of FIGS. 3 to 8.

FIGS. 3, 5, 7 and 9 relate to a standard lens having the characteristics stated above with an aspherized rear face. FIGS. 4, 6, 8 and 10 relate to a lens according to the invention having the characteristics stated above with an aspherized and connected rear face.

The lens has a substantially umbilical line, termed meridian, which substantially coincides with the vertical axis of the lens. The figures show the meridian and the fitting cross CM of the lens which can be marked geometrically on the lens by a cross or any other mark such as a dot surrounded by a circle drawn on the lens, or by any other appropriate means; it is a centring point marked on the lens which is used by the optician to fit the lens in the frame. In spherical coordinates, the fitting cross CM has the coordinates (0, 0) since it corresponds to the point of intersection of the front face of the lens with the primary direction of glance, as defined previously.

Figure 3:
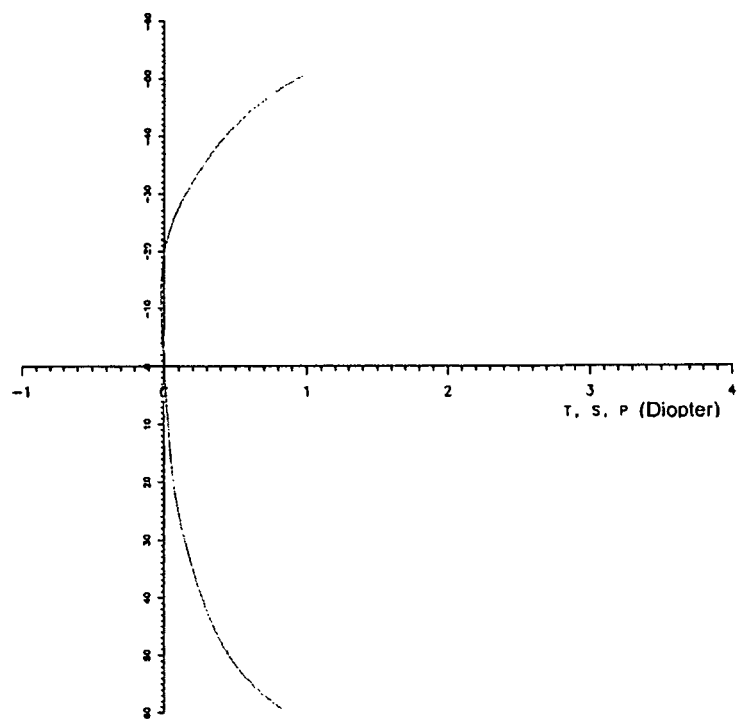
FIGS. 3 and 4, wearer optical power graphs along the meridian respectively of a standard curved and bent unifocal lens and of a curved and bent unifocal lens according to the invention.
Figure 4:
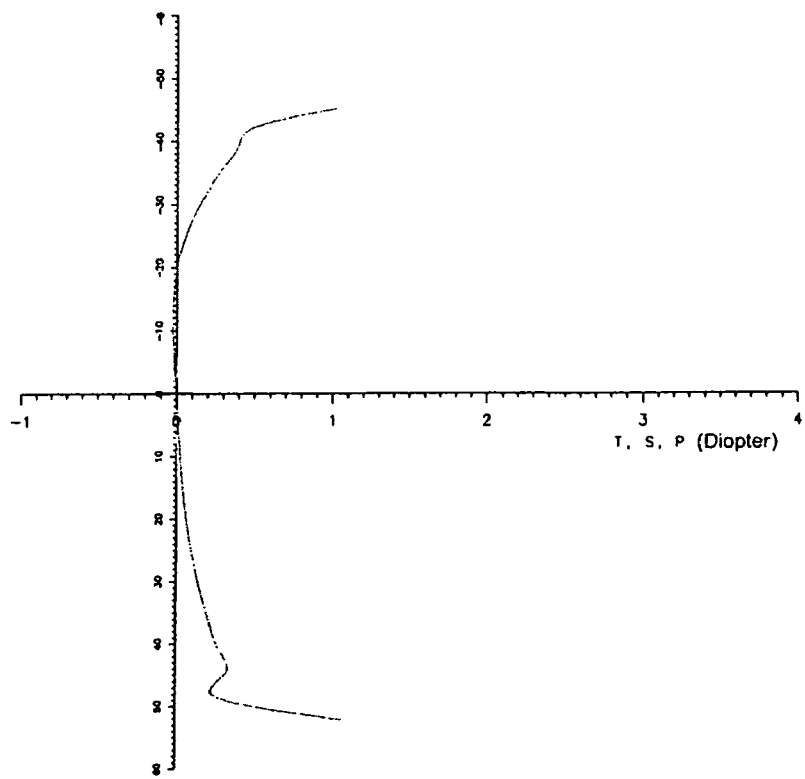

FIGS. 3 and 4 show the wearer optical power along the meridian respectively for the standard curved and bent unifocal lens and for the curved and bent unifocal lens according to the invention; the angle β was plotted on the ordinate-axis and the power in diopters on the abscissa-axis. The minimum and maximum optical powers corresponding respectively to the quantities 1/JT and 1/JS defined previously were recorded as a dotted line and the optical power P as defined previously was recorded as a solid line.

It will be noted in FIG. 4 that the connecting zone introduces steps in power in the upper and lower parts of the meridian. However, these steps in power are situated beyond the wearer's natural field of view.

In FIGS. 5 to 8, the lens is represented in a reference frame in spherical coordinates, the angle beta being plotted on the abscissa-axis and the angle alpha on the ordinate-axis.

Figure 5:
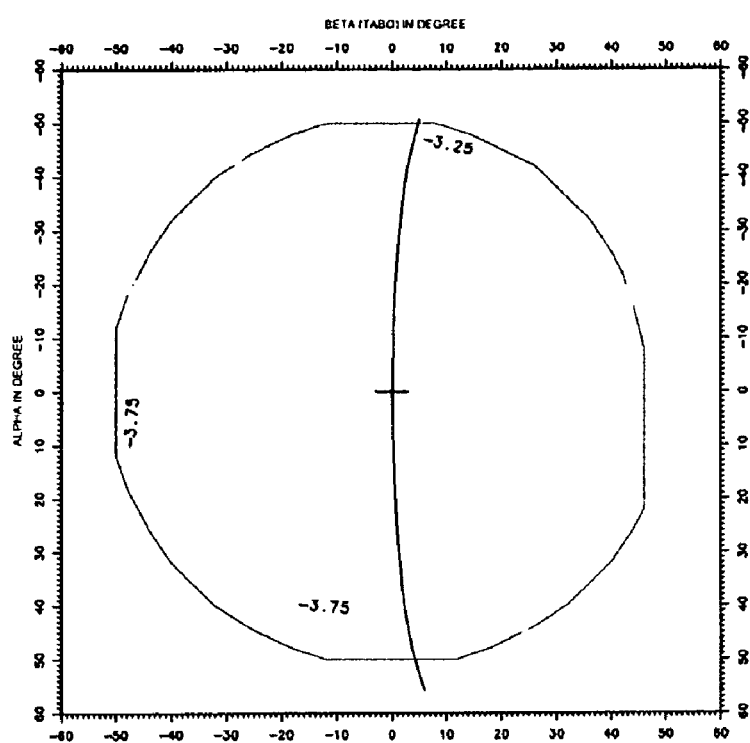
FIGS. 5 and 6, wearer optical power maps of the lenses of FIGS. 3 and 4 respectively.
Figure 6:
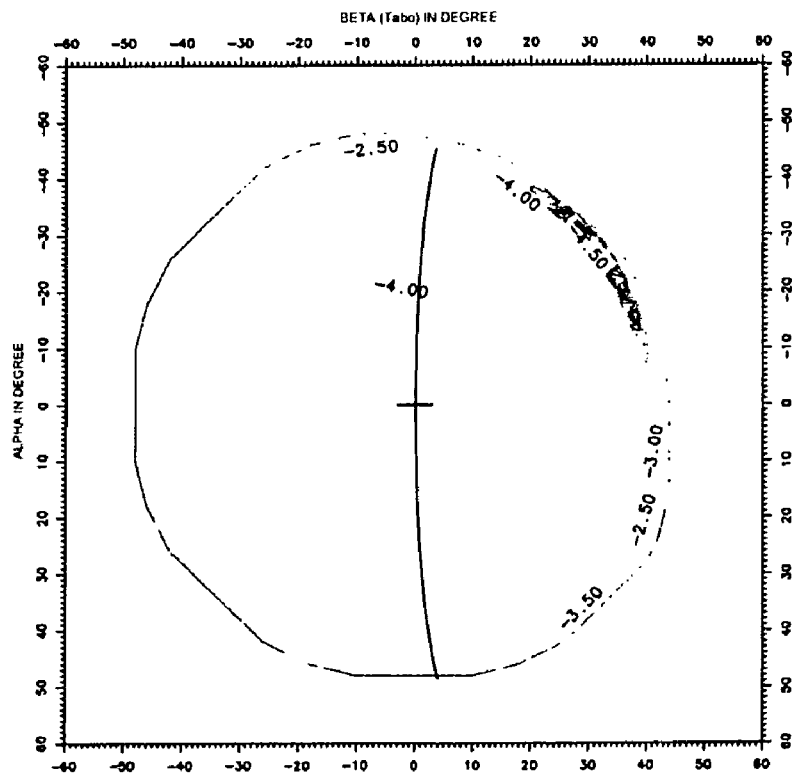

FIGS. 5 and 6 show the wearer optical power level lines defined in a direction of glance and for an object point respectively for the standard curved and bent unifocal lens and for the curved and bent unifocal lens according to the invention. As is usual, the iso-power lines were plotted in FIGS. 5 and 6 in a frame in spherical coordinates; these lines are formed from points having the same optical power value P. It will be noted in FIG. 6 that the optically useful zone meeting the power prescription of −4 diopters is substantially identical to the zone of FIG. 5.

Figure 7:
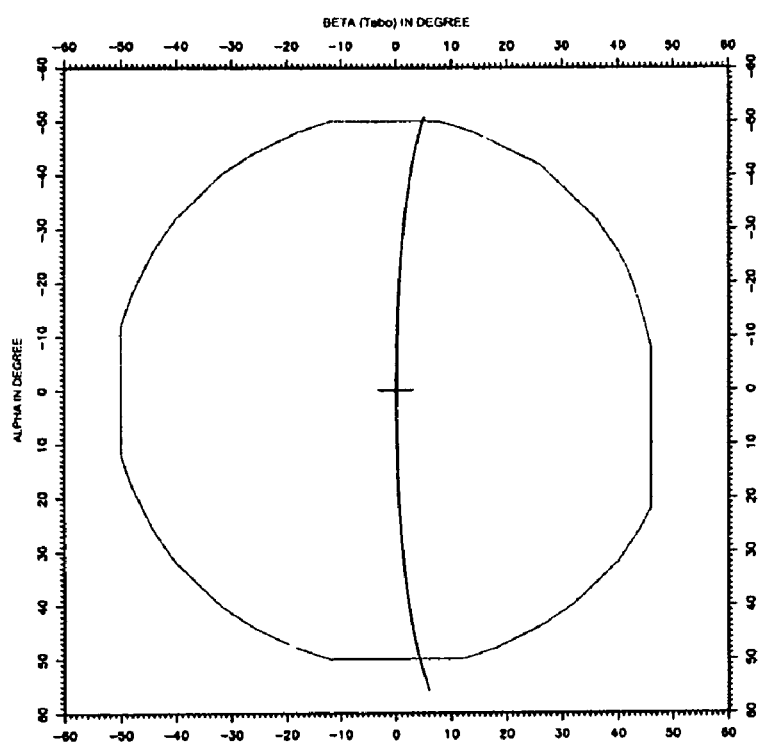
FIGS. 7 and 8, resulting astigmatism module maps for a wearer of the lenses of FIGS. 3 and 4 respectively.
Figure 8:
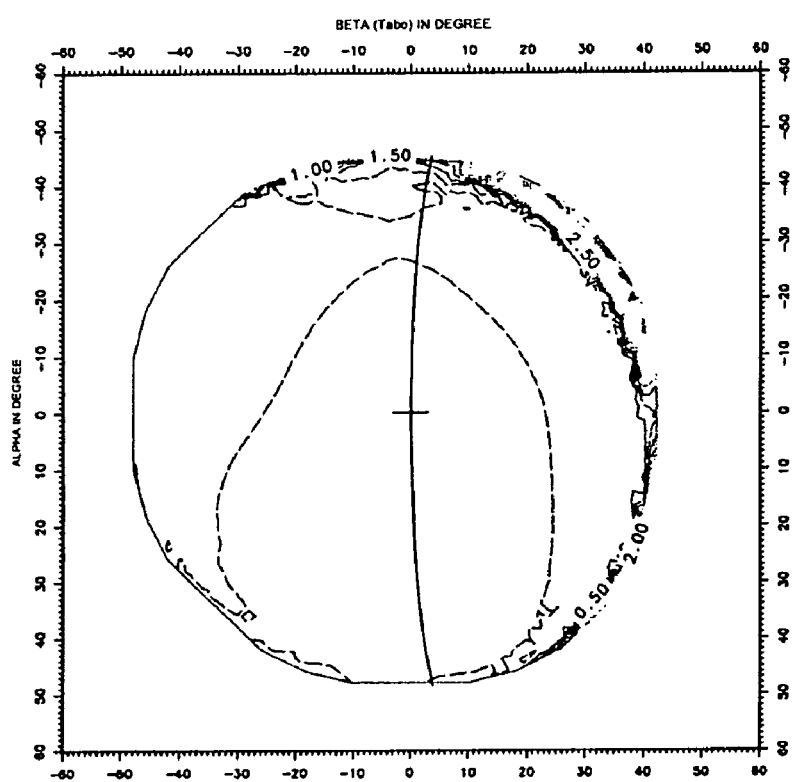

FIGS. 7 and 8 show the lines of the oblique astigmatism amplitude level in wearing conditions; i.e. the resulting astigmatism module, respectively for the standard curved and bent unifocal lens and for the curved and bent unifocal lens according to the invention. As is usual, the iso-astigmatism lines were plotted in FIGS. 7 and 8 in a frame in spherical coordinates; these lines are formed from points having the same astigmatism amplitude value, as defined previously. It will be apparent in FIG. 8 that the lens of the invention has a central zone without any astigmatism defect of substantially the same size as the zone in FIG. 7.

It will also be noted that the power and astigmatism defects are accentuated on the circumference of the lens according to the invention (FIGS. 6 and 8), i.e. in the peripheral zone, compared with the standard lens (FIGS. 5 and 7). However, the transition between the central zone and the peripheral zone of the lens according to the invention is continuous and regular and is not detrimental to the optical qualities of the central zone.

Figure 9:
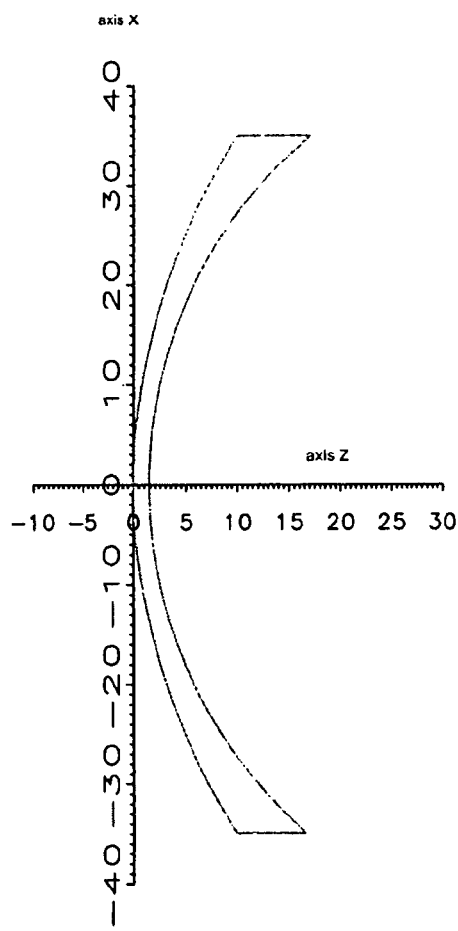
FIGS. 9 and 10, diagrammatic cross sections of the lenses of FIGS. 3 and 4 respectively.
Figure 10:
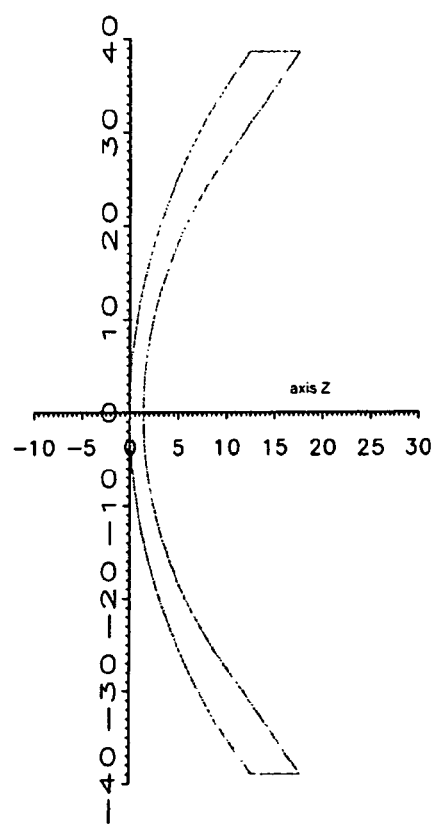

FIGS. 9 and 10 show diagrammatic cross sections of the lenses respectively for the standard curved and bent unifocal lens and for the curved and bent unifocal lens according to the invention. The standard lens (FIG. 9) has a centre thickness of 1.4 mm and an edge thickness comprised between 8 mm and 9.2 mm. In contrast, the lens according to the invention (FIG. 10) has a centre thickness of 1.4 mm for an edge thickness comprised between 5 mm and 5.8 mm. A lens thinned in this way is much lighter when worn and easier to incorporate into a frame.

The invention therefore allows the thickness of a lens having a significant curvature, for example greater than 6 diopters, to be reduced considerably, for insertion into a curved frame for example, without being detrimental to the optical characteristics of the lens for the same prescription.

According to a second example of embodiment, FIGS. 11 to 18 show a progressive multifocal lens with a prescription of +4 diopters for far vision and an addition of 2.5 diopters with a spherical front face of base 8. The lens has a prism of 1.44° with a geometric base orientated at 270° in the TABO frame. The plane of the lens is inclined with respect to the vertical by 8° and has a curving contour of 15° for a diameter of 78 mm. The lens has an index of 1.665. A value of q' of 27 mm (as defined with reference to FIG. 43) was considered for the measurements on the lens of FIGS. 11 to 16.

FIGS. 11, 13, 15 and 17 relate to a standard lens having the characteristics stated above with an aspherized degressive rear face. FIGS. 12, 14, 16 and 18 relate to a lens according to the invention having the characteristics stated above with an aspherized and connected degressive rear face.

The figures show that the meridian substantially coincides with the vertical axis in the upper part of the lens and has an inclination on the nasal side in the lower part of the lens, the convergence being more marked in near vision. The figures also show the references on the lens, in particular the fitting cross CM, the far-vision reference point VL—situated on the meridian and corresponding to raising the eyes by 8° above the fitting cross—and the near-vision reference point VP—situated on the meridian and corresponding to lowering the eyes by 35° below the fitting cross.

Figure 11:
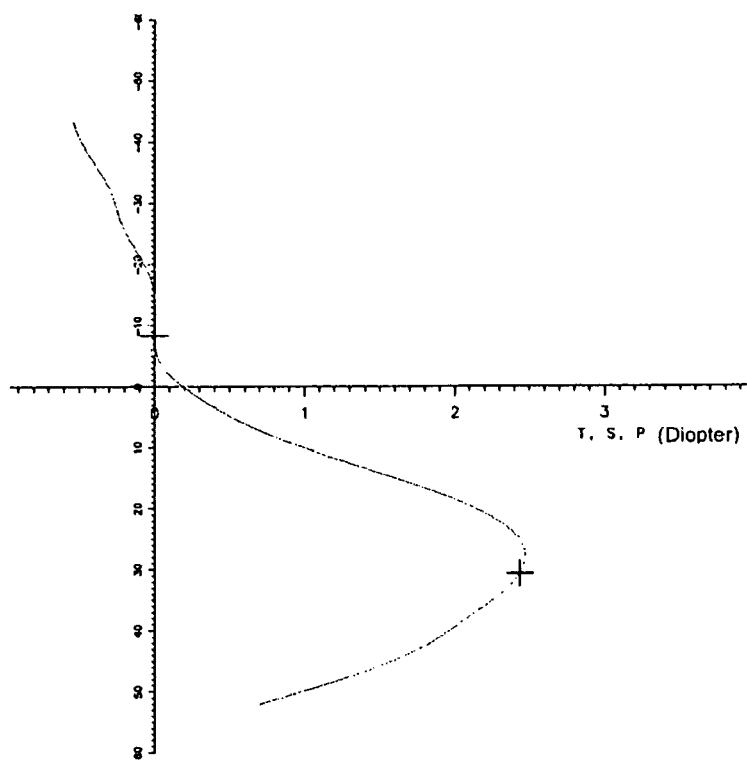
FIGS. 11 and 12, wearer optical power graphs along the meridian respectively of a standard curved and bent progressive multifocal lens of positive prescription and a curved and bent progressive multifocal lens of positive prescription according to the invention.
Figure 12:
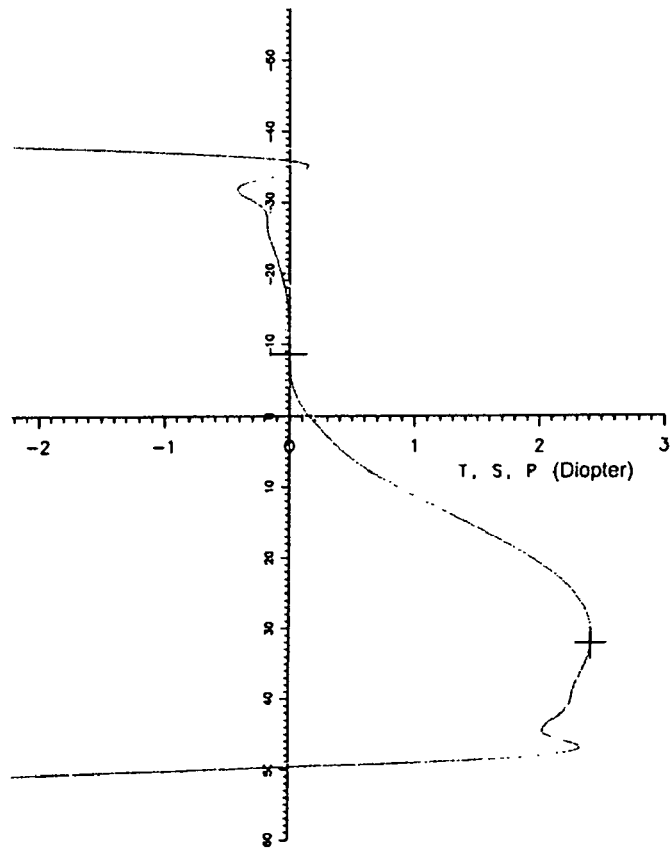

FIGS. 11 and 12 show the wearer optical power along the meridian respectively for the standard curved and bent multifocal lens and for the curved and bent multifocal lens according to the invention; the angle β was plotted on the ordinate-axis and the power in diopters on the abscissa-axis. The intermediate-vision zone generally starts, for a progressive multifocal lens, at the level of the fitting cross CM.

A wearer optical power which is substantially constant around the far-vision reference point VL, a wearer optical power which is substantially constant around the near-vision reference point VP and a regular power progression along the meridian can be noted in the figures. The values are shifted to zero at the origin, where the optical power in reality is 4 diopters, corresponding to the wearer's prescription for far vision. It will also be noted in FIG. 12 that the connecting zone introduces steps in power in the upper and lower parts of the meridian, well beyond the reference points VP and VL, therefore well outside the wearer's field of view.

In FIGS. 13 to 16, the lens is represented in a frame in spherical coordinates, the angle beta being represented on the abscissa-axis and the angle alpha on the ordinatee-axis.

Figure 13:
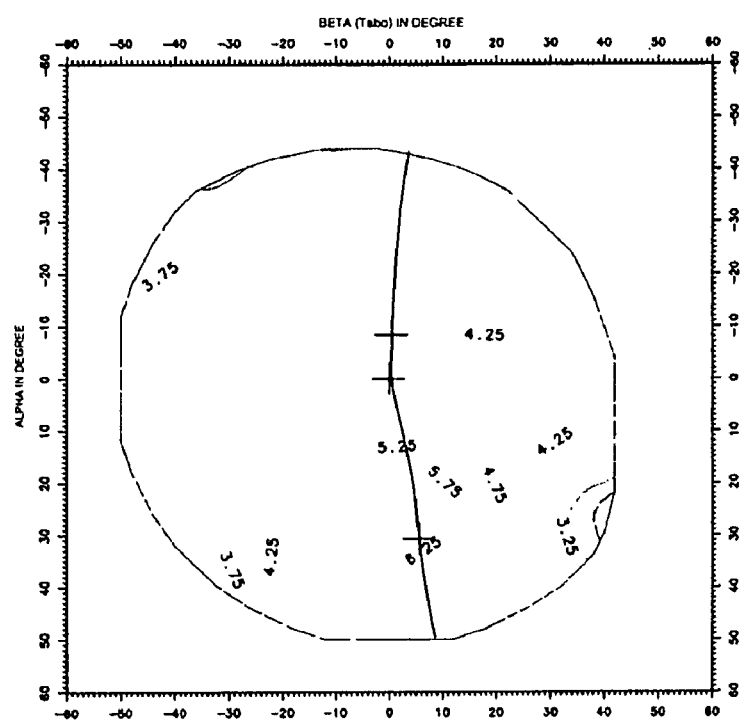
FIGS. 13 and 14, wearer optical power maps of the lenses of FIGS. 11 and 12 respectively.
Figure 14:
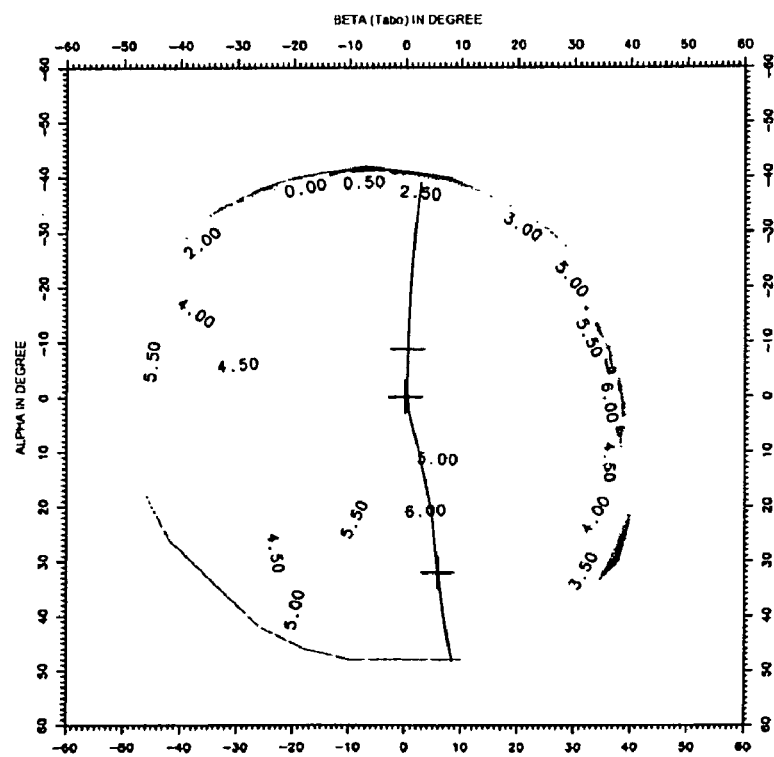

FIGS. 13 and 14 show the wearer optical power level lines defined in a direction of glance and for an object point respectively for the standard curved and bent multifocal lens and for the curved and bent multifocal lens according to the invention. When FIGS. 13 and 14 are compared, it will be noted that the lens according to the invention has substantially the same power defect distribution as the standard lens for a same prescription.

Figure 15:
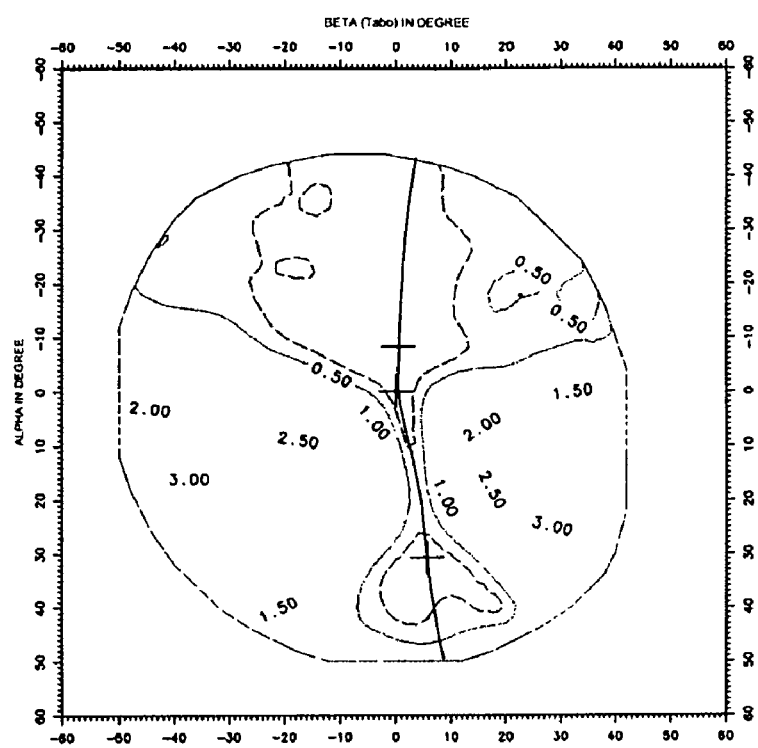
FIGS. 15 and 16, resulting astigmatism module maps for a wearer of the lenses of FIGS. 11 and 12 respectively.
Figure 16:
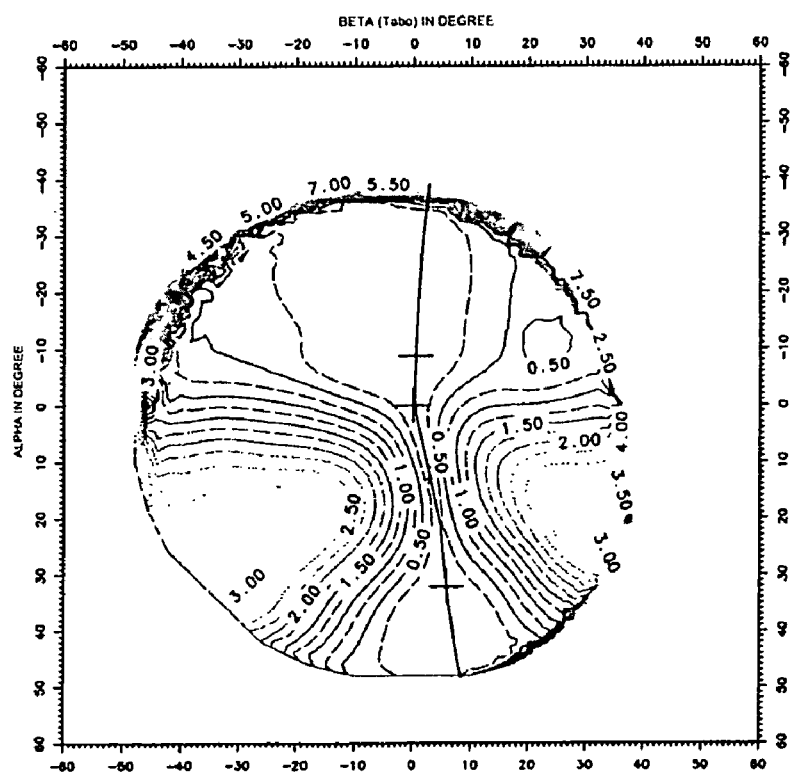

FIGS. 15 and 16 show the lines of the oblique astigmatism amplitude level in the wearing conditions; i.e. the resulting astigmatism module, respectively for the standard curved and bent multifocal lens and for the curved and bent multifocal lens according to the invention. It will be noted that the far-vision zone is relatively clear so as to free the field of far vision and that the iso-astigmatism lines widen, in the lower part of the lens, at the height of the near-vision reference point VP in order to delimit a near-vision VP corridor. When FIGS. 15 and 16 are compared, it will be noted that the lens according to the invention has substantially the same astigmatism defect distribution as the standard lens for the same prescription, the near-vision corridor nevertheless being wider around the reference point VP on the lens of the invention compared with the standard lens.

It will also be noted, as for FIGS. 5 to 8, that the power and astigmatism defects are accentuated on the circumference of the lens according to the invention (FIGS. 14 and 16), i.e. in the peripheral zone, compared with the standard lens (FIGS. 13 and 15). However, the transition between the central zone and the peripheral zone of the lens according to the invention is continuous and regular and is not detrimental to the optical qualities of the central zone.

Figure 17:
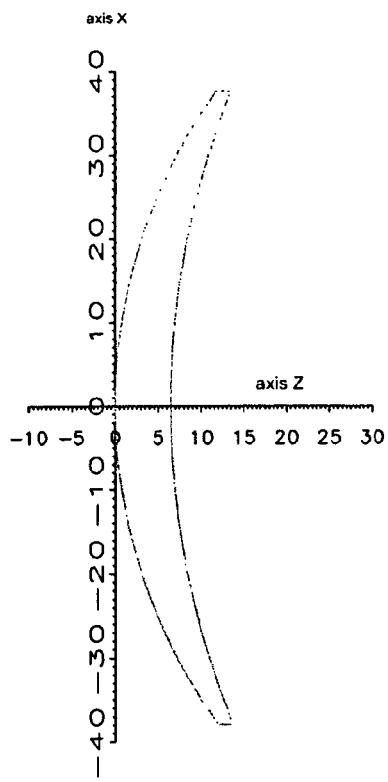
FIGS. 17 and 18, diagrammatic cross sections of the lenses of FIGS. 11 and 12 respectively.
Figure 18:
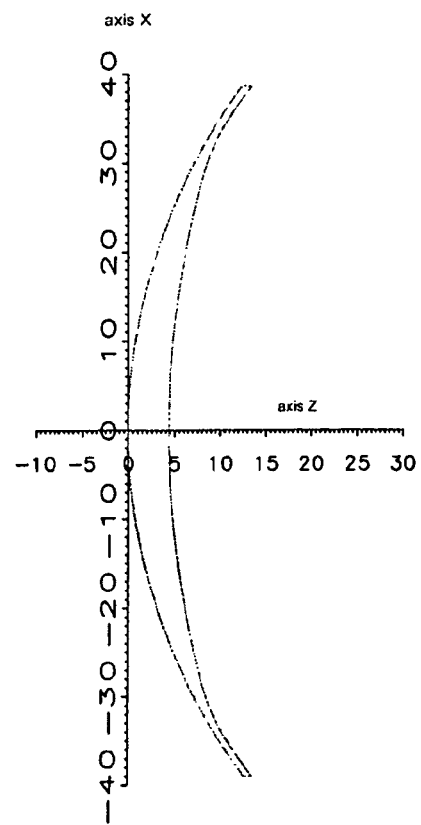

FIGS. 17 and 18 show diagrammatic cross sections of the lenses respectively for the standard curved and bent multifocal lens and for the curved and bent multifocal lens according to the invention. The standard lens (FIG. 17) has a centre thickness of 6.41 mm and an edge thickness comprised between 0.5 mm and 2.1 mm. In contrast, the lens according to the invention (FIG. 18) has a centre thickness of 4.4 mm for an edge thickness comprised between 0.5 mm and 1.2 mm. A lens thinned in this way is much lighter when worn and easier to incorporate into a frame.

The invention therefore allows the thickness of a multifocal lens of positive prescription and having a significant curving contour, for example greater than 6 diopters, to be considerably reduced, for incorporation into a curved frame for example, without being detrimental to the optical characteristics of the lens for a same prescription.

According to a third example of embodiment, FIGS. 19 to 26 show a progressive multifocal lens with a prescription of −4 diopters for far vision and an addition of 2.5 diopters with a spherical front face of base 8. The lens has a prism of 1.19° with a geometric base orientated at 282.4° in the TABO frame. The plane of the lens is inclined with respect to the vertical by 8° and has a curving contour of 15° for a diameter of 70 mm. The lens has an index of 1.665. A value of q' of 27 mm (as defined with reference to FIG. 43) was considered for the measurements on the lens of FIGS. 19 to 26.

FIGS. 19, 21, 23 and 25 relate to a standard lens having the characteristics stated above with an aspherized degressive rear face. FIGS. 20, 22, 24 and 26 relate to a lens according to the invention having the characteristics stated above with an aspherized and connected rear face having degressive central and peripheral zones.

As in FIGS. 11 to 16, the fitting cross CM, the far-vision reference point VL and the near-vision reference point VP were recorded in FIGS. 19 to 24.

Figure 19:
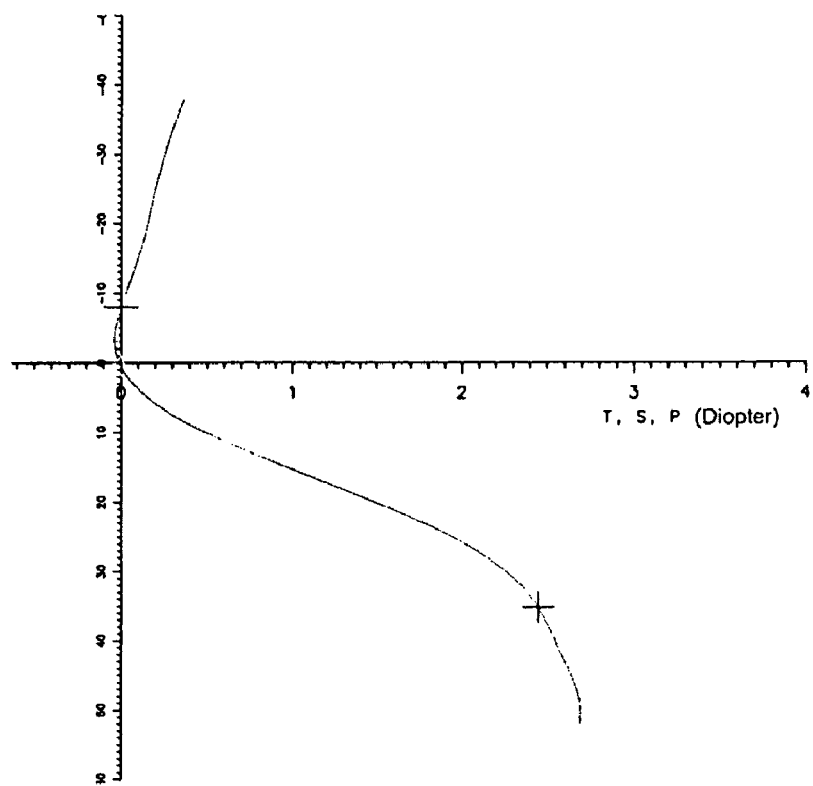
FIGS. 19 and 20, wearer optical power graphs along the meridian respectively of a standard curved and bent progressive multifocal lens of negative prescription and a curved and bent progressive multifocal lens of negative prescription according to the invention.
Figure 20:
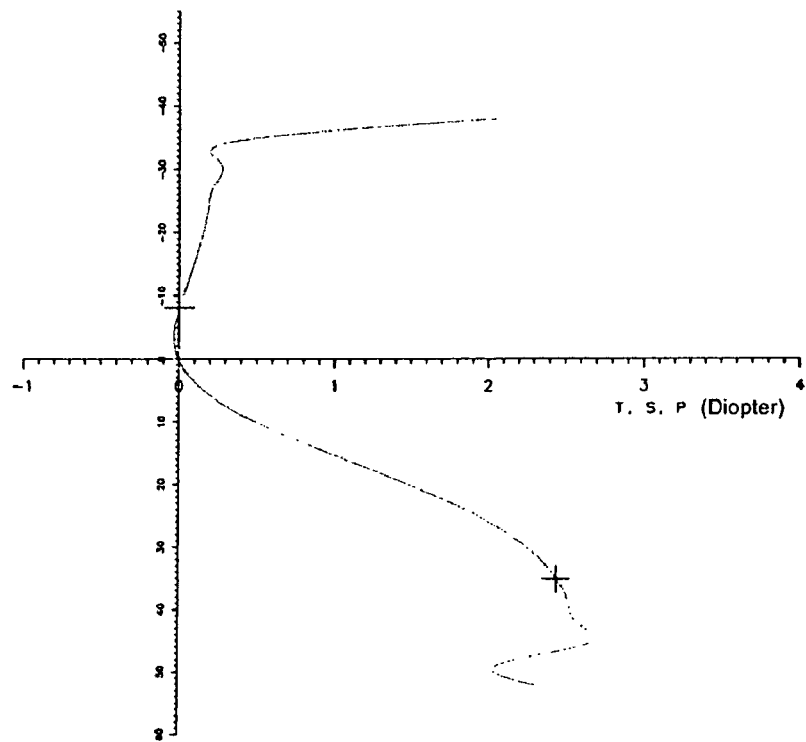

FIGS. 19 and 20 show the wearer optical power along the meridian respectively for the standard multifocal lens and for the multifocal lens according to the invention; the angle beta was plotted on the ordinate-axis and the power in diopters on the abscissa-axis. The values are shifted to zero at the origin, where the optical power is in reality −4 diopters, corresponding to the wearer's prescription for far vision. It will also be noted in FIG. 20 that the connecting zone introduces steps in power in the upper and lower parts of the meridian, well beyond the reference points VP and VL, therefore well outside the wearer's field of view.

In FIGS. 21 to 24, the lens is represented in a reference frame in spherical coordinates, the angle beta being plotted on the abscissa-axis and the angle alpha on the ordinate-axis.

Figure 21:
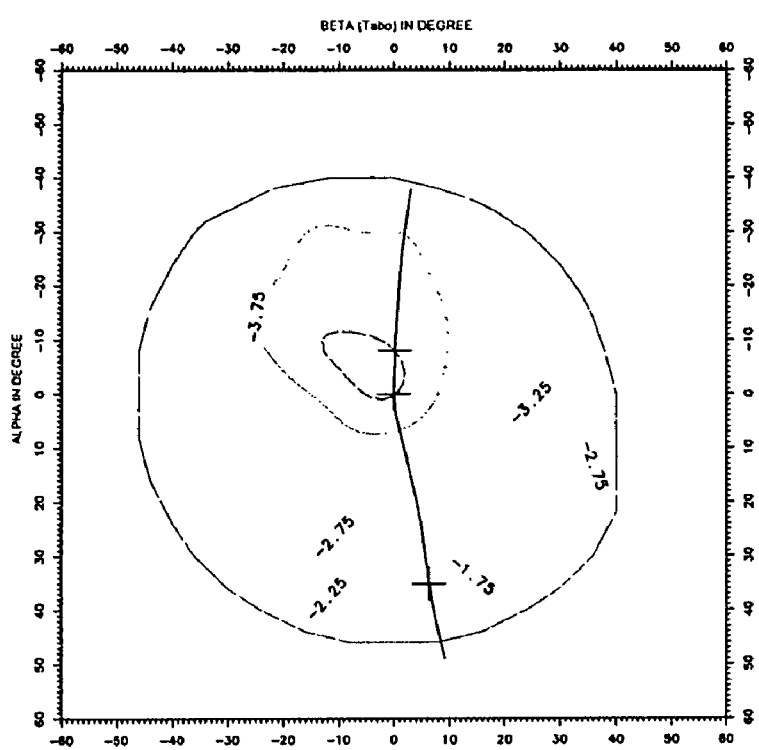
FIGS. 21 and 22, wearer optical power maps of the lenses of FIGS. 19 and 20 respectively.
Figure 22:
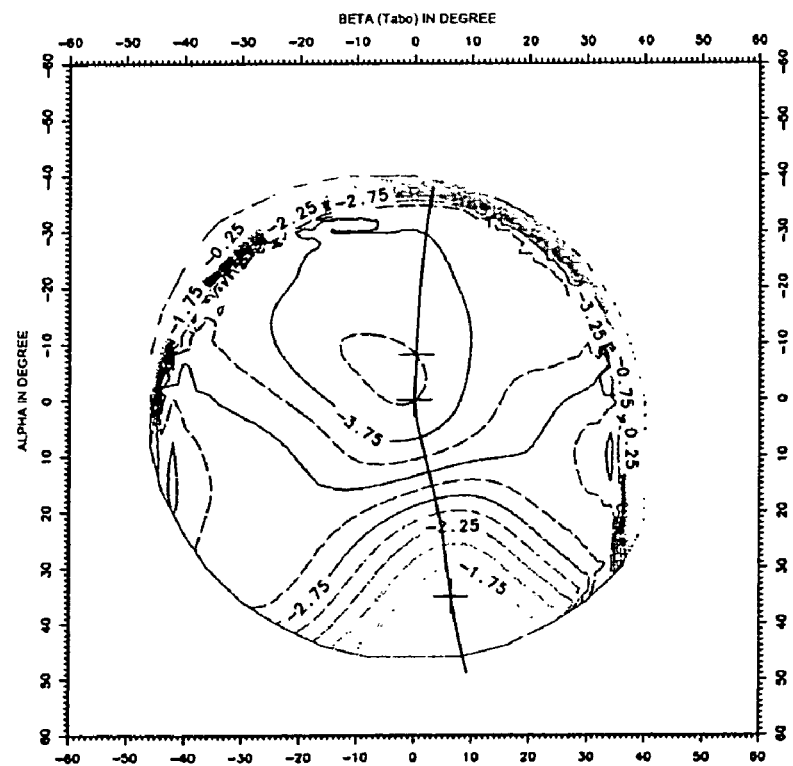

FIGS. 21 and 22 show the wearer optical power level lines defined in a direction of glance and for an object point respectively for the standard curved and bent multifocal lens and for the curved and bent multifocal lens according to the invention. When FIGS. 21 and 22 are compared, it will be noted that the lens according to the invention has substantially the same power defect distribution as the standard lens for the same prescription.

Figure 23:
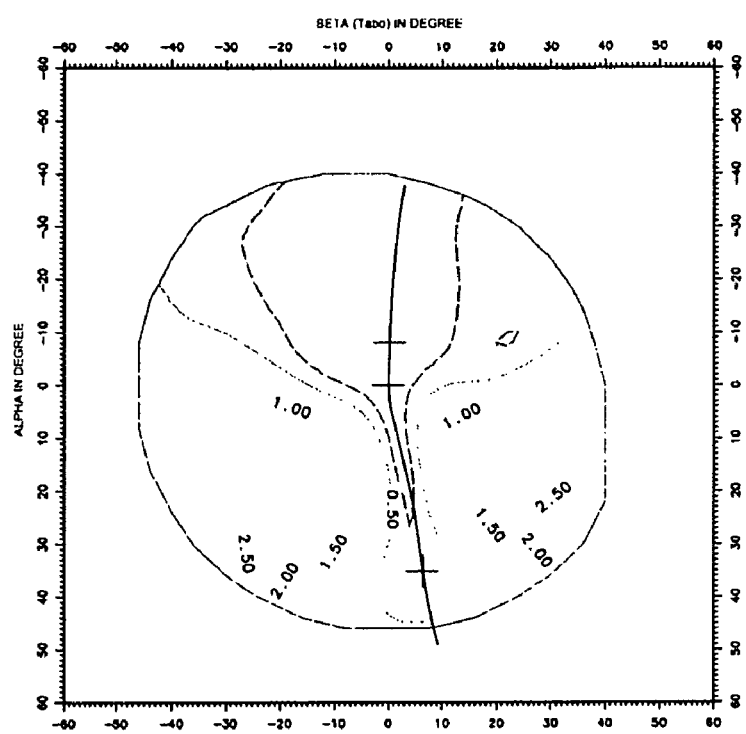
FIGS. 23 and 24, resulting astigmatism module maps for a wearer of the lenses of FIGS. 19 and 20 respectively.
Figure 24:
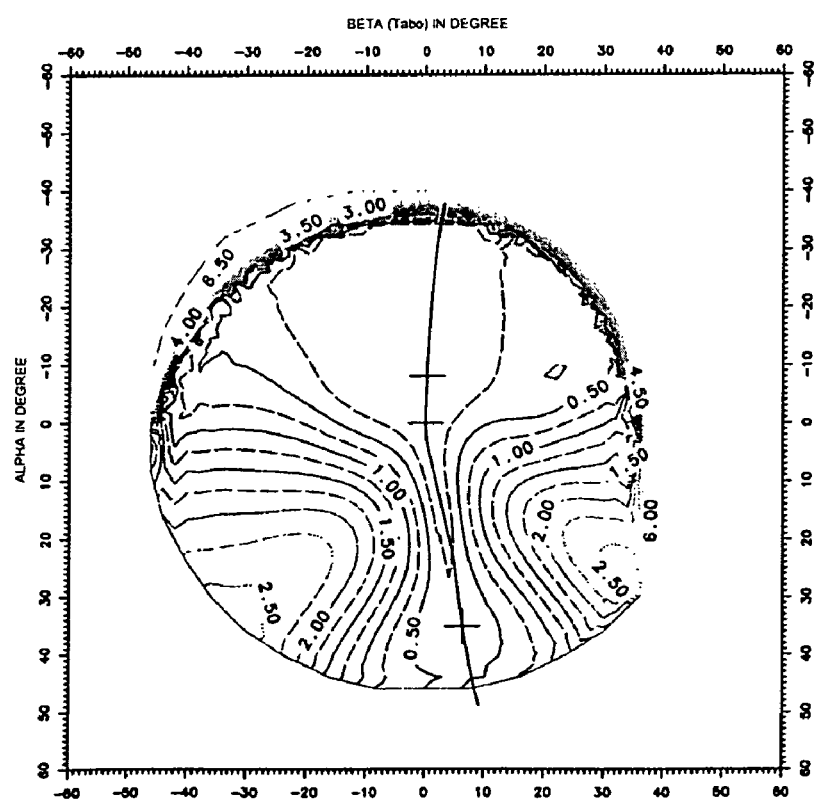

FIGS. 23 and 24 show the lines of the oblique astigmatism amplitude level in wearing conditions; i.e. the resulting astigmatism module, respectively for the standard curved and bent multifocal lens and for the curved and bent multifocal lens according to the invention. When FIGS. 23 and 24 are compared, it will be noted that the lens according to the invention has substantially the same astigmatism defect distribution as the standard lens for the same prescription.

It will also be noted, as for FIGS. 13 to 16, that the power and astigmatism defects are accentuated on the circumference of the lens according to the invention (FIGS. 22 and 24), i.e. in the peripheral zone, compared with the standard lens (FIGS. 21 and 23).

Figure 25:
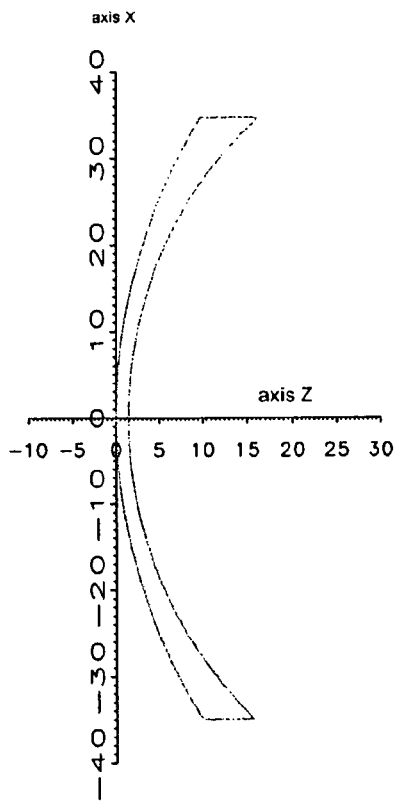
FIGS. 25 and 26, diagrammatic cross sections of the lenses of FIGS. 19 and 20 respectively.
Figure 26:
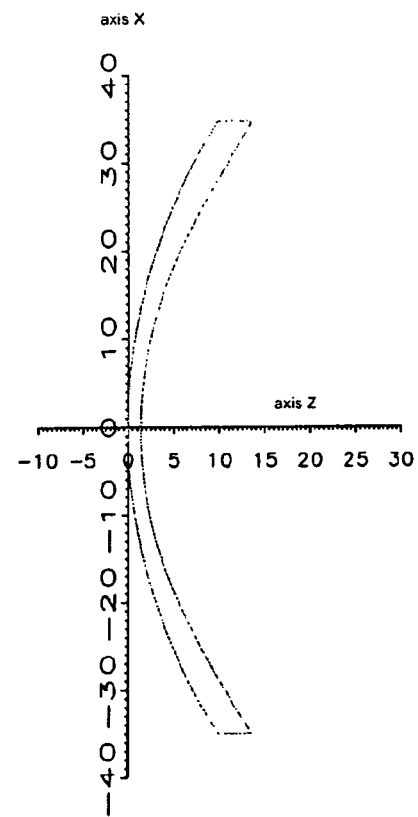

FIGS. 25 and 26 show diagrammatic cross sections of the lenses respectively for the standard curved and bent multifocal lens and for the curved and bent multifocal lens according to the invention. The standard lens (FIG. 25) has a centre thickness of 1.40 mm and an edge thickness comprised between 5.01 mm and 6.62 mm. In contrast, the lens according to the invention (FIG. 26) has an edge thickness comprised between 3.52 mm and 4.73 mm for a centre thickness of 1.40 mm. A lens thinned in this way is much lighter when worn and easier to incorporate into a frame.

The invention therefore allows the thickness of a multifocal lens of negative prescription and having a significant curving contour, for example greater than 6 diopters, to be considerably reduced, for incorporation into a curved frame for example, without being detrimental to the optical characteristics of the lens for the same prescription.

According to a fourth example of embodiment, FIGS. 27 to 34 show a progressive multifocal lens with a prescription of −6 diopters for far vision and an addition of 2.5 diopters with a complex front face of base 2. The lens has a prism of 1.52° with a geometric base orientated at 270° in the TABO reference frame. The plane of the lens is inclined with respect to the vertical by 8° and has a curving contour of zero for a diameter of 65 mm. The lens has an index of 1.502. A value of q' of 27 mm (as defined with reference to FIG. 43) was considered for the measurements on the lens of FIGS. 27 to 34.

FIGS. 27, 29, 31 and 33 relate to a standard lens having the characteristics stated above with a progressive front face and a spherical rear face. FIGS. 28, 30, 32 and 34 relate to a lens according to the invention having the characteristics stated above with a progressive front face and a connected rear face.

As in FIGS. 11 to 16, the fitting cross CM, the far-vision reference point VL and the near-vision reference point VP were recorded in FIGS. 27 to 32.

Figure 27:
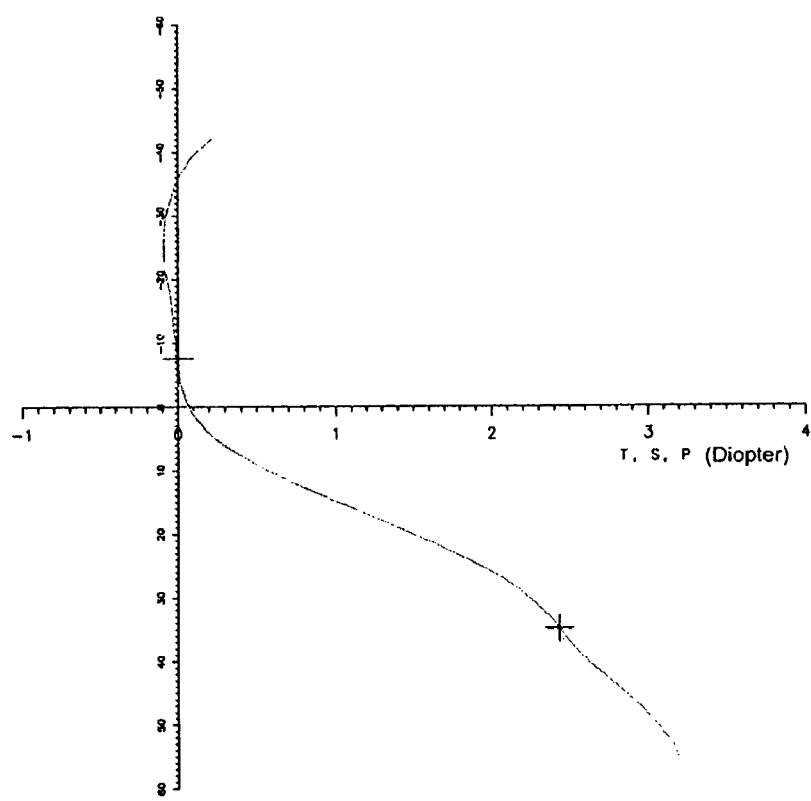
FIGS. 27 and 28, wearer optical power graphs along the meridian respectively of a standard progressive multifocal lens with high negative prescription and a progressive multifocal lens with high negative prescription according to the invention.
Figure 28:
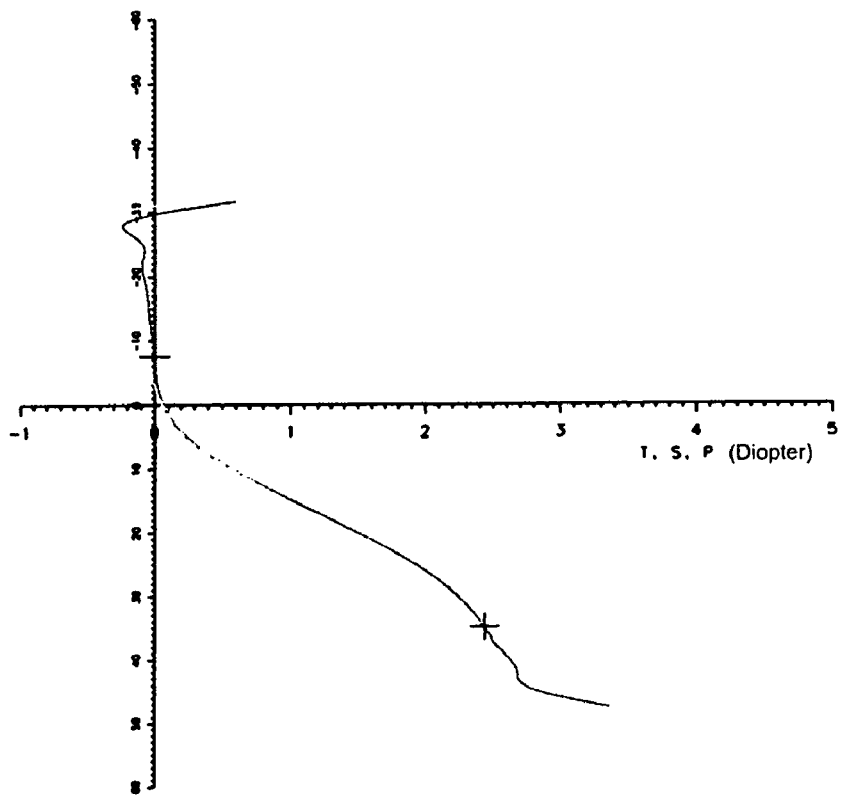

FIGS. 27 and 28 show the wearer optical power along the meridian respectively for the standard multifocal lens and for the multifocal lens according to the invention; the angle β was plotted on the ordinate-axis and the power in diopters on the abscissa-axis.

It will also be noted in FIG. 28 that the connecting zone introduces steps in power in the upper and lower parts of the meridian, well beyond the reference points VP and VL, therefore well outside the wearer's field of view.

In FIGS. 29 to 32, the lens is represented in a frame in spherical coordinates, the angle beta being plotted on the abscissa-axis and the angle alpha on the ordinate-axis.

Figure 29:
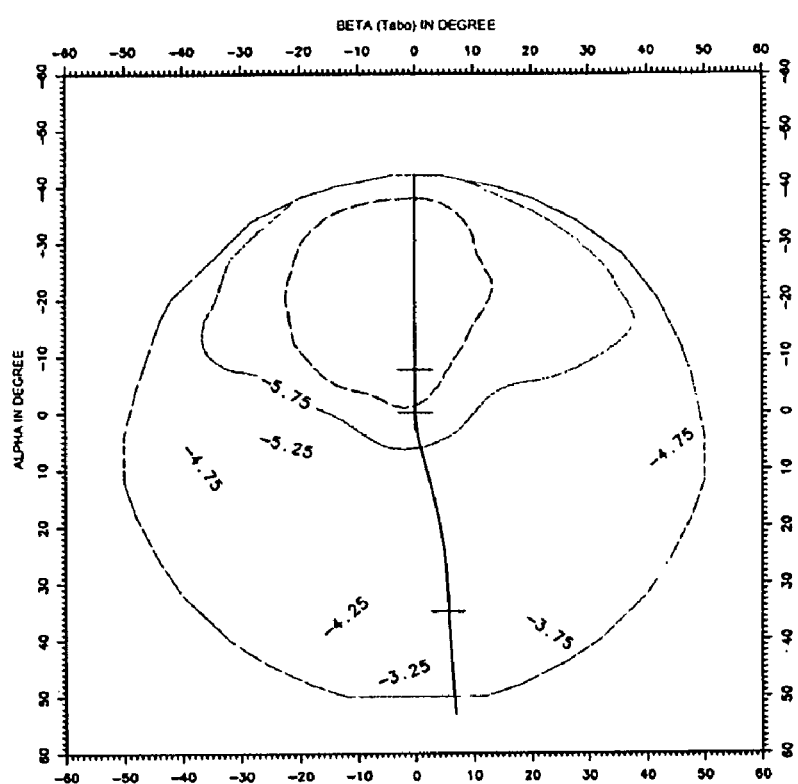
FIGS. 29 and 30, wearer optical power maps of the lenses of FIGS. 27 and 28 respectively.
Figure 30:
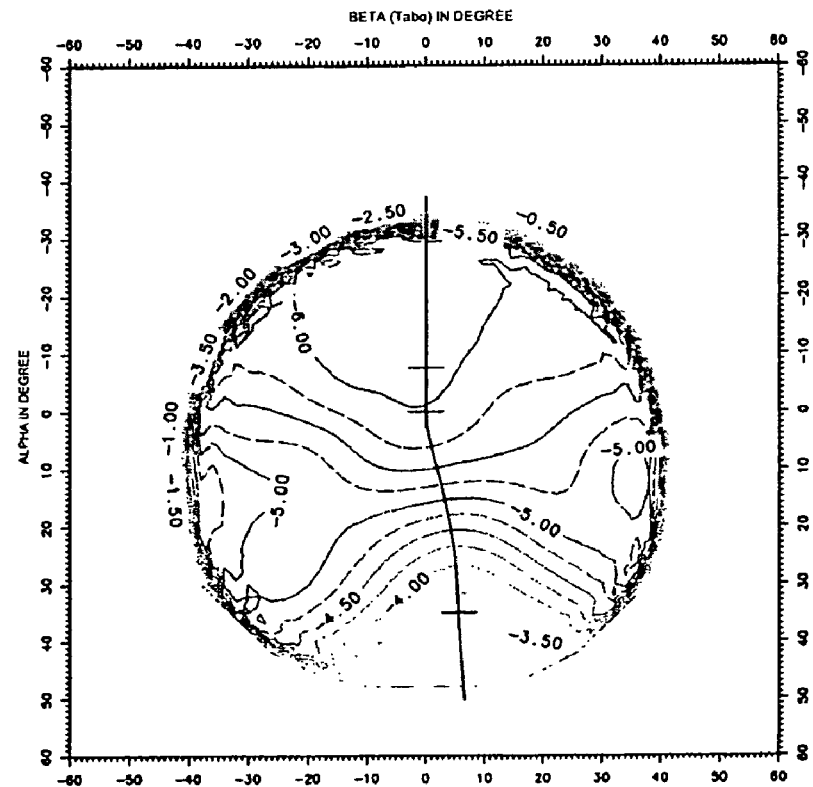

FIGS. 29 and 30 show the wearer optical power level lines defined in a direction of glance and for an object point respectively for the standard multifocal lens and for the multifocal lens according to the invention. When FIGS. 29 and 30 are compared, it will be noted that the lens according to the invention has substantially the same power defect distribution as the standard lens for a same prescription.

Figure 31:
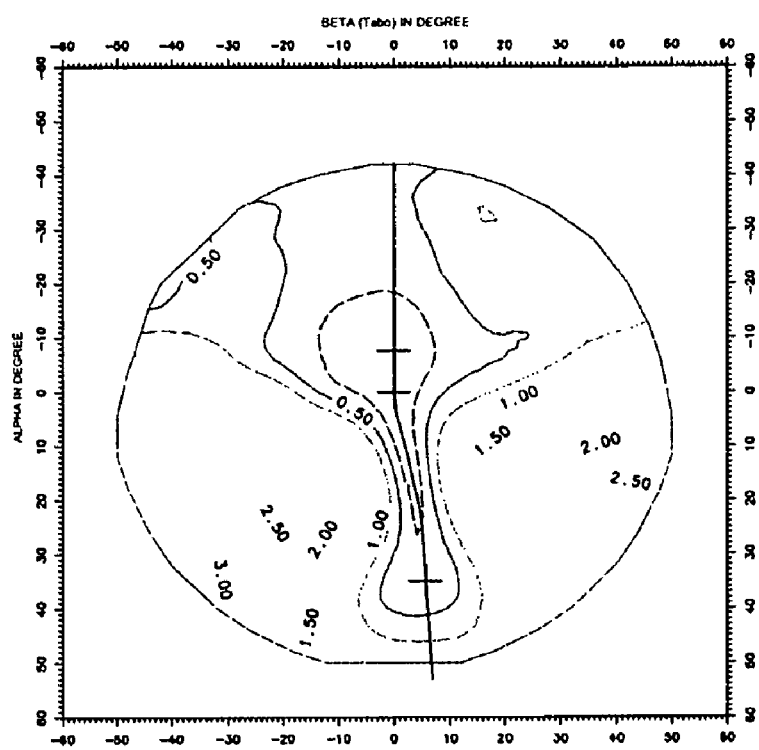
FIGS. 31 and 32, resulting astigmatism module maps for a wearer of the lenses of FIGS. 27 and 28 respectively.
Figure 32:
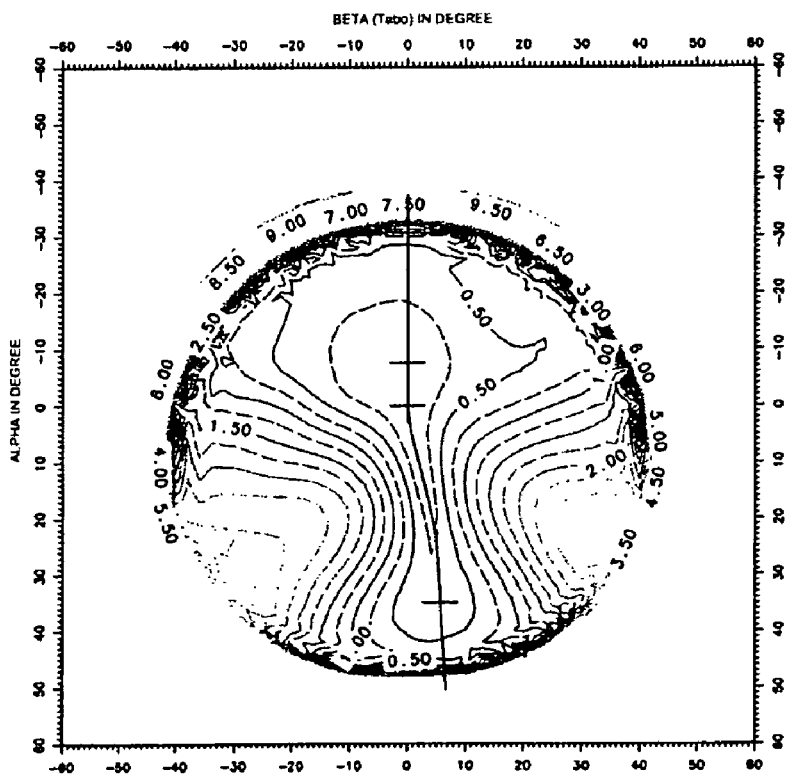

FIGS. 31 and 32 show the lines of the oblique astigmatism amplitude level in the wearing conditions; i.e. the resulting astigmatism module, respectively for the standard multifocal lens and for the multifocal lens according to the invention. When FIGS. 31 and 32 are compared, it will be noted that the lens according to the invention has substantially the same astigmatism defect distribution as the standard lens for a same prescription.

It will also be noted, as for the figures of the previous embodiments, that the power and astigmatism defects are accentuated on the circumference of the lens according to the invention (FIGS. 30 and 32), i.e. in the peripheral zone, compared with the standard lens (FIGS. 29 and 31). However, the transition between the central zone and the peripheral zone of the lens according to the invention is continuous and regular and is not detrimental to the optical qualities of the central zone.

Figure 33:
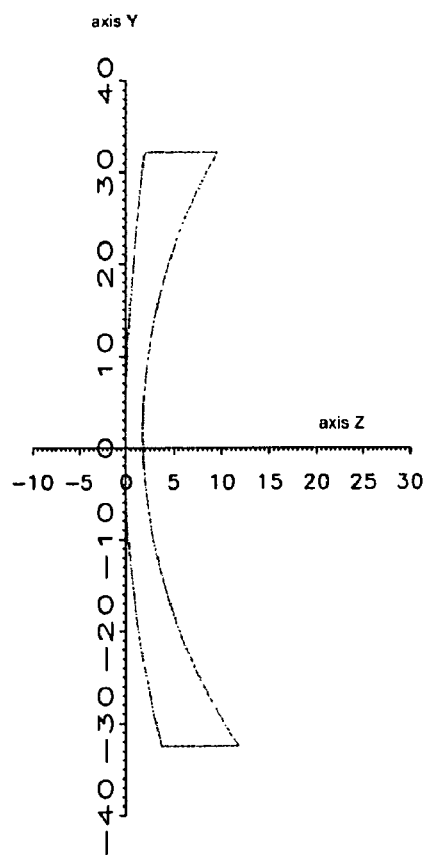
FIGS. 33 and 34, diagrammatic cross sections of the lenses of FIGS. 27 and 28 respectively.
Figure 34:
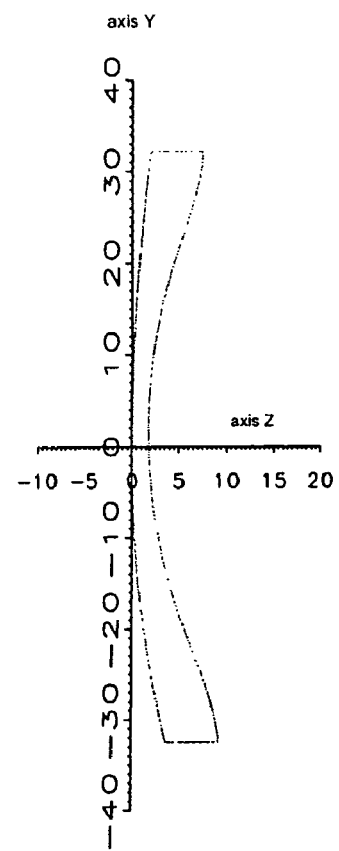

FIGS. 33 and 34 show diagrammatic cross sections of the lenses respectively for the standard multifocal lens and for the multifocal lens according to the invention. The standard lens (FIG. 33) has a centre thickness of 1.8 mm and an edge thickness comprised between 7.7 mm and 8.4 mm. In contrast, the lens according to the invention (FIG. 34) has a centre thickness of 1.8 mm for an edge thickness comprised between 5.5 mm and 6.2 mm. A lens thinned in this way is much lighter when worn and easier to incorporate into a frame.

The invention therefore allows the thickness of a multifocal lens having a high negative power prescription, for example greater than −4 diopters, to be considerably reduced, without being detrimental to the optical characteristics of the lens for a same prescription.

According to a fifth example of embodiment, FIGS. 35 to 42 show a progressive multifocal lens with a prescription of +3 diopters for far vision and an addition of 2 diopters with a complex front face of base 6.5. The lens has a prism of 1.52° with a geometric base orientated at 270° in the TABO reference frame. The plane of the lens is inclined with respect to the vertical by 8° and has a curving contour of zero for a diameter of 65 mm. The lens has an index of 1.502. A value of q' of 27 mm (as defined with reference to FIG. 43) was considered for the measurements on the lens of FIGS. 35 to 42.

FIGS. 35, 37, 39 and 41 relate to a standard lens having the characteristics stated above with a progressive front face and a spherical rear face. FIGS. 36, 38, 40 and 42 relate to a lens according to the invention having the characteristics stated above with a connected progressive front face. As in FIGS. 11 to 16, the fitting cross CM, the far-vision reference point VL and the near-vision reference point VP were recorded in FIGS. 35 to 40.

Figure 35:
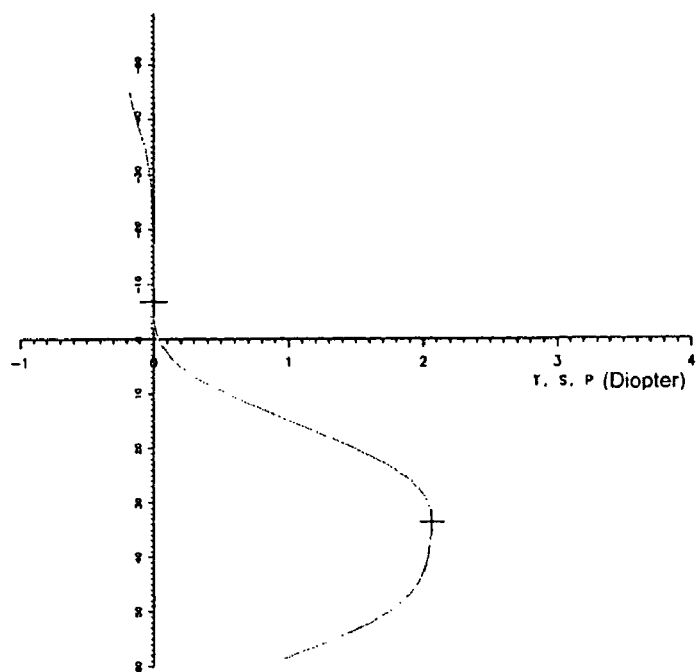
FIGS. 35 and 36, wearer optical power graphs along the meridian respectively of a standard progressive multifocal lens with high positive prescription and a progressive multifocal lens with high positive prescription according to the invention.
Figure 36:
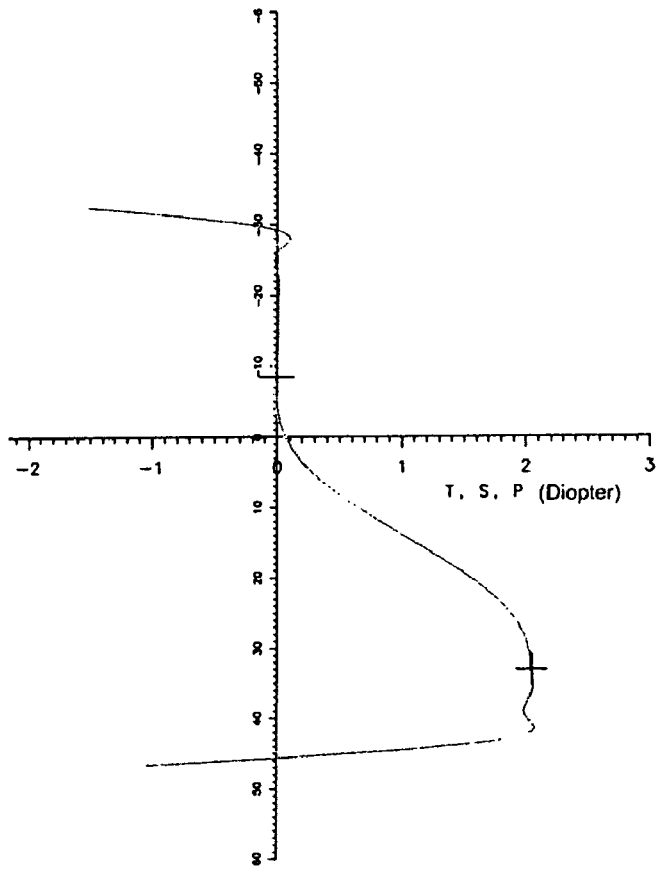

FIGS. 35 and 36 show the wearer optical power along the meridian respectively for the standard multifocal lens and for the multifocal lens according to the invention; the angle β was plotted on the ordinate-axis and the power in diopters on the abscissa-axis.

It will be noted in FIGS. 35 and 36 that the wearer optical power around the reference points VL and VP is substantially constant. It will also be noted in FIG. 36 that the connecting zone introduces steps in power in the upper and lower parts of the meridian, well beyond the reference points VP and VL, therefore well outside the wearer's field of view.

In FIGS. 37 to 40, the lens is represented in a frame in spherical coordinates, the angle beta being plotted on the abscissa-axis and the angle alpha on the ordinate-axis.

Figure 37:
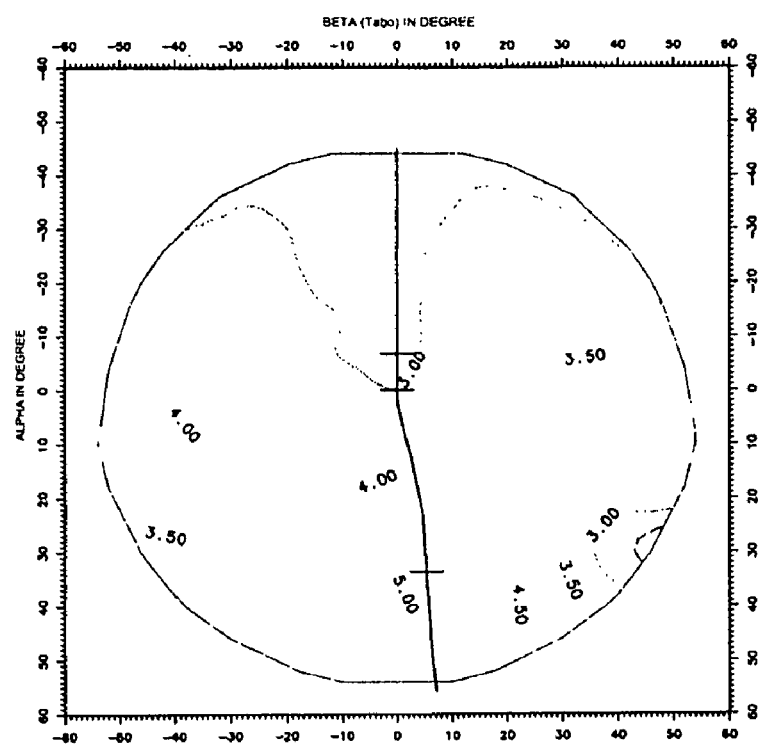
FIGS. 37 and 38, wearer optical power maps of the lenses of FIGS. 35 and 36 respectively.
Figure 38:
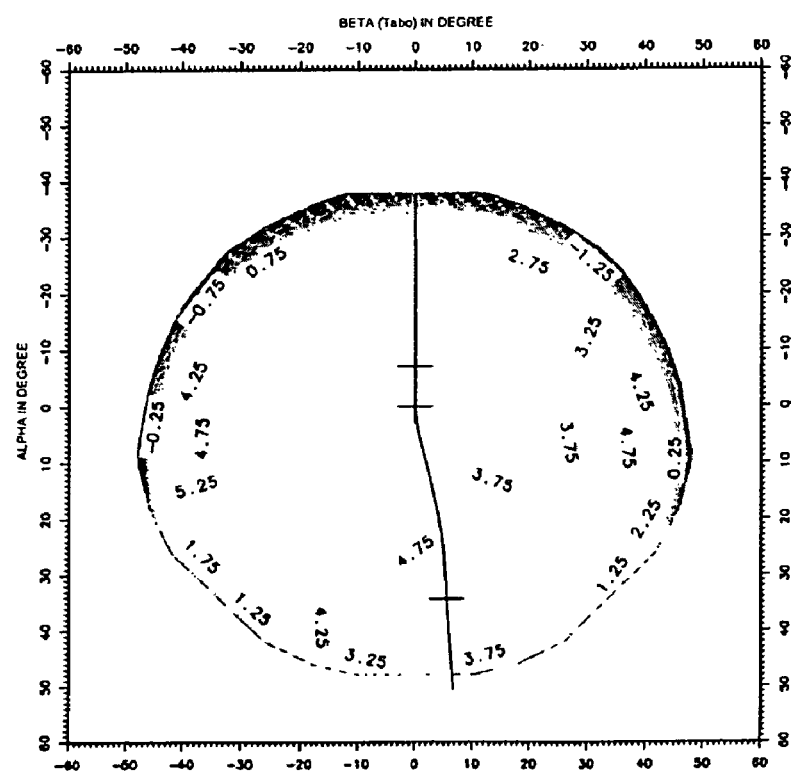

FIGS. 37 and 38 show the wearer optical power level lines defined in a direction of glance and for an object point respectively for the standard multifocal lens and for the multifocal lens according to the invention. When FIGS. 37 and 38 are compared, it will be noted that the lens according to the invention has substantially the same power defect distribution as the standard lens for a same prescription.

Figure 39:
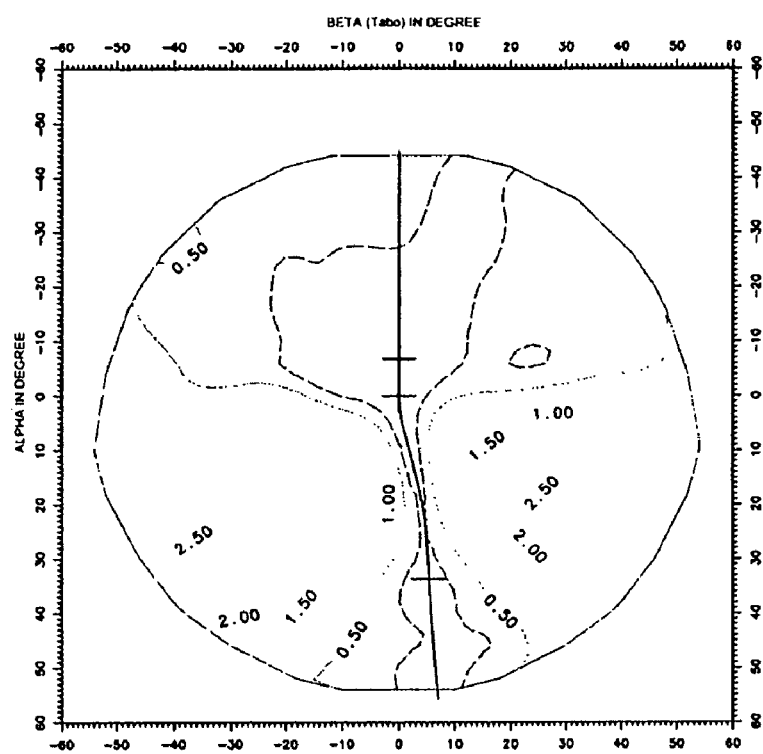
FIGS. 39 and 40, resulting astigmatism module maps for a wearer of the lenses of FIGS. 35 and 36 respectively.
Figure 40:
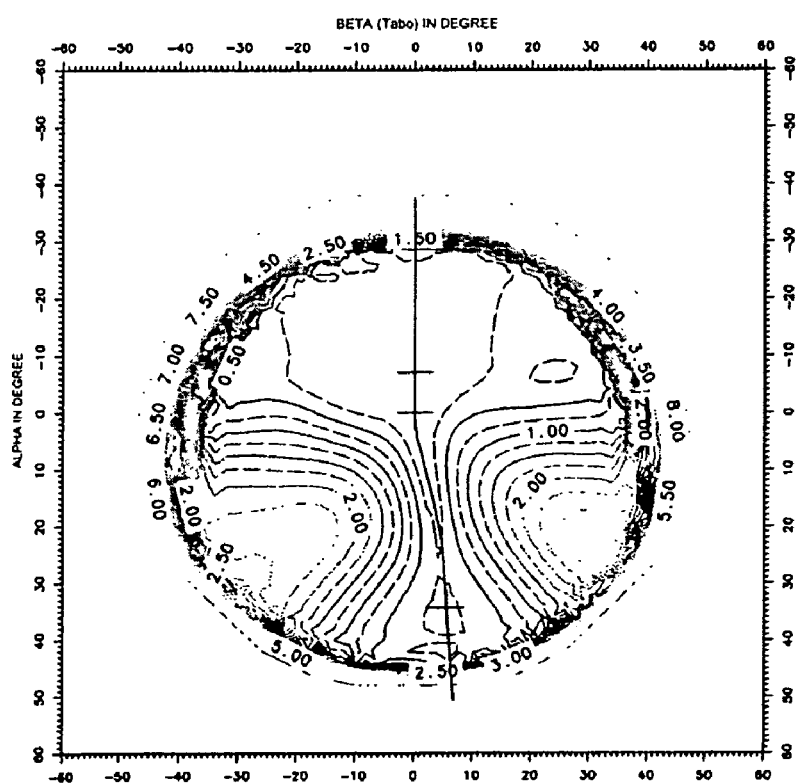

FIGS. 39 and 40 show the lines of the oblique astigmatism amplitude level when worn; i.e. the resulting astigmatism module, respectively for the standard multifocal lens and for the multifocal lens according to the invention. When FIGS. 39 and 40 are compared, it will be noted that the lens according to the invention has substantially the same astigmatism defect distribution as the standard lens for a same prescription.

It will also be noted, as for the corresponding figures of the previous examples, that the power and astigmatism defects are accentuated on the circumference of the lens according to the invention (FIGS. 38 and 40), i.e. in the peripheral zone, compared with the standard lens (FIGS. 37 and 39). However, the transition between the central zone and the peripheral zone of the lens according to the invention is continuous and regular and is not detrimental to the optical qualities of the central zone.

Figure 41:
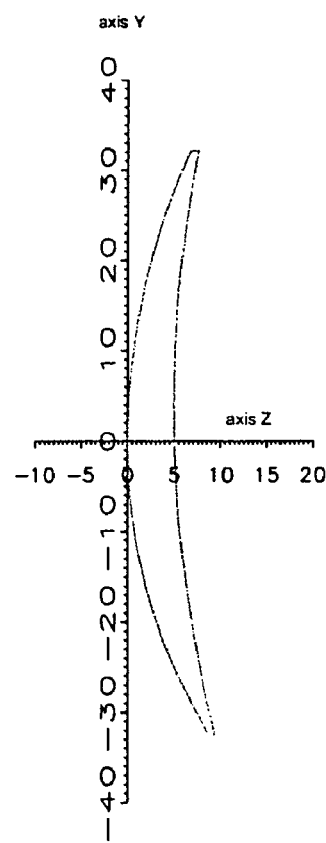
FIGS. 41 and 42, diagrammatic cross sections of the lenses of FIGS. 35 and 36 respectively.
Figure 42:
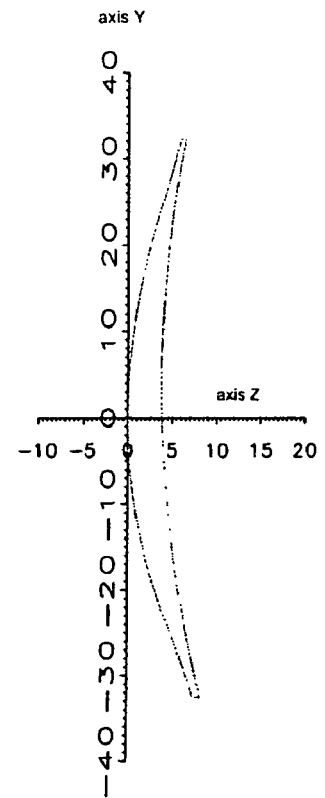

FIGS. 41 and 42 show diagrammatic cross sections of the lenses respectively for the standard multifocal lens and for the multifocal lens according to the invention. The standard lens (FIG. 41) has a centre thickness of 5.0 mm and an edge thickness comprised between 0.5 mm and 1.4 mm. In contrast, the lens according to the invention (FIG. 42) has a centre thickness of 3.8 mm for an edge thickness comprised between 0.5 mm and 0.9 mm. A lens thinned in this way is much lighter when worn and easier to incorporate into a frame.

The invention therefore allows the thickness of a multifocal lens having a high positive power prescription, for example greater than +3 diopters, to be considerably reduced, without being detrimental to the optical characteristics of the lens for the same prescription.

In order to carry out the optimization of a lens according to the invention, a lens having a first face with a surface having a maximum radius of curvature is considered as the initial lens.

A central zone and a peripheral zone are also defined on the second face of the lens. This peripheral zone has a maximum radius of curvature comprised between the value of the maximum radius of curvature of the first face and the value of the maximum radius of curvature of the central zone. The value of the maximum radius of curvature of the peripheral zone which makes it possible to obtain an optimal thinning of the lens will be chosen. Substantially flat lens edges can be imposed for example. Thus, if the first face is spherical, the peripheral zone of the surface of the second face can be spherical and have the same radius of curvature as the first face; if the first face is toric, the peripheral zone of the surface of the second face can be toric and have the same larger meridian value as the first face. If the surface of the first face is complex, the peripheral zone of the surface of the second face can be spherical or toric and have the value of the maximum radius of curvature of the first face as value for the radius of curvature or larger meridian, or the peripheral zone of the surface of the second face can also be complex and have the value of the maximum radius of curvature of the first face or a value comprised between this maximum radius of curvature of the first face and the maximum radius of curvature of the central zone of the second face as the value for the maximum radius of curvature. In particular, if the central zone has a power variation, the peripheral zone can have a power variation of the same kind (progression or degression).

The lens is thus considered under the wearing conditions by setting the eye-lens distance q', the pantoscopic angle (or vertical inclination) and curving contour values. The centre thickness of the lens and a lens index are provided.

Then targets are set for the optimization of the lens. Targets having given power, astigmatism module and astigmatism axis values for particular direction of glance are defined for an optically useful central zone.

The lens is thus determined by optimization. To this end, a current lens is considered; initially, this current lens is the initial lens. The characteristics of the second face of the current lens are varied so as to come close to the target values of the central zone while calculating an interpolated surface comprising a connecting zone between the central and peripheral zones. The interpolated surface of the second face of the lens is calculated with a chosen interpolation formula and for a relative altitude of the peripheral zone compared with the given central zone. This relative altitude of the peripheral zone compared with the central zone is varied, i.e. the peripheral zone is moved away from or towards the central zone along the Z axis to obtain the best extrapolated surface compared with a given merit function, for example one of the merit functions mentioned previously—minimization of the sphere and cylinder root mean square deviations in the two directions X and Y or over the circles delimiting the central and peripheral zones; minimization of the maximum cylinder or the sphere or cylinder slopes in the connecting zone.

For the optimization, various representations of the surface or surfaces which vary can be used. In the example, only the rear face of the lens is varied, but the front face could also be varied. The face or faces which vary can be represented by Zernike polynomials; an aspherical layer, superimposed on one or other of the faces, can be used and this aspherical layer can be varied. The optimization can use techniques known per se. In particular, the damped least squares (DLS) optimization method could be used.

The invention thus allows a lens that is curved and/or has a high prescription of reduced thickness to be obtained without accentuating the obliquity defects for good visual comfort for the user.

What is claimed is:

1. A method for determining an ophthalmic lens comprising:
choosing a lens with a first face and a second face;
defining an initial surface for the second face of the lens with a central zone of diameter $D_{ini}$, and a peripheral zone of inner diameter $D_{rac}$ greater than the diameter $D_{ini}$, of the central zone,
one or more points in the central zone and one or more points in the peripheral zone situated on the inner diameter $D_{rac}$ having an altitude defined with respect to an axis (Z) normal to the second face of the lens and having the centre of the central zone as its origin, the altitude of the peripheral zone being defined as the altitude of a lowest point situated on the inner diameter $D_{rac}$;
the peripheral zone having a maximum radius of curvature comprised between the maximum radius of curvature of the first face and the maximum radius of curvature of the central zone;
choosing an interpolation formula;
optimizing the lens by applying:
target values for power and astigmatism for a given direction of glance in the central zone of the second face of the lens;
the interpolation formula to the central and peripheral zones to define an interpolated surface comprising a connecting zone, the interpolated surface minimizing a merit function for different relative altitudes of the peripheral zone with respect to the central zone.

2. The method for determining an ophthalmic lens of claim 1, in which the optimization of the central zone of the current lens is carried out under wearing conditions.

3. The method for determining an ophthalmic lens of claim 1, in which the merit function is a minimization of a maximum cylinder value in the connecting zone.

4. The method for determining an ophthalmic lens of claim 1, in which the merit function is a minimization of a norm of a sphere or cylinder gradient in the connecting zone.

5. The method for determining an ophthalmic lens of claim 1, in which the central, connecting and peripheral zones are centred on a same centring point of the surface of the second face of the lens, said centring point marking a primary direction of glance under wearing conditions.

6. The method for determining an ophthalmic lens of claim 1, in which the first face of the lens is complex.

7. The method for determining an ophthalmic lens of claim 1, in which the first face and the peripheral zone of the second face of the lens are spherical.

8. The method for determining an ophthalmic lens of claim 1, in which the first face and the peripheral zone of the second face of the lens are toric.

9. The method for determining an ophthalmic lens of claim 1, in which the central zone of the second face exhibits a power variation.

10. The method for determining an ophthalmic lens of claim 1, in which the central zone and the peripheral zone of the second face exhibit a power variation.

11. The method for determining an ophthalmic lens of claim 1, in which the diameter ($D_{ini}$) of the central zone is greater than or equal to 30 mm and less, by at least 10 mm, than a total diameter ($D_{fin}$) of the lens before trimming (30 mm $\leq D_{ini} \leq D_{fin} - 10$ mm).

12. The method for determining an ophthalmic lens of claim 1, in which the inner diameter ($D_{rac}$) of the peripheral zone is greater than or equal, by at least 10 mm, to the diameter of the central zone ($D_{ini}$) and less than a total diameter ($D_{fin}$) of the lens before trimming.

13. The method for determining an ophthalmic lens of claim 1, in which the merit function is a minimization of sphere and cylinder root mean square deviations calculated over a set of points between the interpolated surface and the initial surfaces of the central and peripheral zones.

14. The method for determining an ophthalmic lens of claim 13, in which the minimization of the sphere and cylinder root mean square deviations is calculated consist, over the circles of diameter $D_{ini}$ and $D_{rac}$, delimiting respectively the central and peripheral zones.

15. The method for determining an ophthalmic lens of claim 13, in which the minimization of the sphere and cylinder root mean square deviations is calculated over the vertical and horizontal axes of the lens.

16. The method for determining an ophthalmic lens of claim 15, in which the merit function of the minimization of the vertical and horizontal sphere and cylinder root mean square deviations between the interpolated surface and the surfaces of the central and peripheral zones is defined as:

$$FM = aFM\_X + bFM\_Y;$$

with a and b being weighting coefficients; and with $$FM\_X = \sqrt{\frac{\sum_{i=1}^{n}(Sph\_xi - Sph'\_xi)^2}{n}} + \sqrt{\frac{\sum_{i=1}^{n}(Cyl\_xi - Cyl'\_xi)^2}{n}}$$

$$FM\_Y = \sqrt{\frac{\sum_{i=1}^{n}(Sph\_yi - Sph'\_yi)^2}{n}} + \sqrt{\frac{\sum_{i=1}^{n}(Cyl\_yi - Cyl'\_yi)^2}{n}}$$

where Sph_xi and Sph_yi are initial sphere values at a considered point in the central zone or in the peripheral zone on an X axis and on a Y axis defined with respect to the Z axis;

where Cyl_xi and Cyl_yi are initial cylinder values at a considered point in the central zone or in the peripheral zone on the X axis and on the Y axis; and where Sph'_xi, Sph'_yi and Cyl'_xi, Cyl'_yi are sphere and cylinder values at a considered point of the interpolated surface in the connecting zone on the X axis and on the Y axis.

17. A visual device comprising a lens having a negative power prescription, the lens having a first face and a second face where the second face comprises an initial surface with a central zone of diameter $D_{ini}$ and a peripheral zone of inner diameter $D_{rac}$ greater than the diameter $D_{ini}$ of the central zone, wherein:

one or more points in the central zone and one or more points in the peripheral zone situated on the inner diameter $D_{rac}$ having an altitude defined with respect to an axis (Z) normal to the second face of the lens and having the centre of the central zone as its origin, the altitude of the peripheral zone being defined as the altitude of a lowest point situated on the inner diameter $D_{rac}$;

the peripheral zone has a maximum radius of curvature between the maximum radius of curvature of the first face and the maximum radius of curvature of the central zone;

wherein the lens is determined based on target values for power and astigmatism for a given direction of glance in the central zone of the second face of the lens and an interpolation formula applied to the central and peripheral zones to define an interpolated surface comprising a connecting zone, the interpolated surface minimizing a merit function for different relative altitudes of the peripheral zone with respect to the central zone.

18. The visual device of claim 17, wherein the negative power prescription is greater than or equal to −4 diopters for far vision.

19. A visual device comprising a lens having a positive power prescription, the lens having a first face and a second face where the second face comprises an initial surface with a central zone of diameter $D_{ini}$, and a peripheral zone of inner diameter $D_{rac}$ of the central zone; wherein:

one or more points in the central zone and one or more points in the peripheral zone situated on the inner diameter $D_{rac}$ having an altitude defined with respect to an axis (Z) normal to the second face of the lens and having the centre of the central zone as its origin, the altitude of the peripheral zone being defined as the altitude of a lowest point situated on the inner diameter $D_{rac}$;

the peripheral zone has a maximum radius of curvature between the maximum radius of curvature of the first face and the maximum radius of curvature of the central zone;

wherein the lens is determined based on target values for power and astigmatism for a given direction of glance in the central zone of the second face of the lens and an interpolation formula applied to the central and peripheral zones to define an interpolated surface comprising a connecting zone, the interpolated surface minimizing a merit function for different relative altitudes of the peripheral zone with respect to the central zone.

20. The visual device of claim 19, wherein the positive power prescription is greater than or equal to +3 diopters for far vision.

21. A visual device comprising a lens having a curvature, the lens having a first face and a second face where the second face comprises an initial surface with a central zone of diameter $D_{ini}$ and a peripheral zone of inner diameter $D_{rac}$ greater than the diameter $D_{ini}$ of the central zone, wherein:

one or more points in the central zone and one or more points in the peripheral zone situated on the inner diameter $D_{rac}$ having an altitude defined with respect to an axis (Z) normal to the second face of the lens and having the centre of the central zone as its origin, the altitude of the peripheral zone being defined as the altitude of a lowest point situated on the inner diameter $D_{rac}$;

the peripheral zone has a maximum radius of curvature between the maximum radius of curvature of the first face and the maximum radius of curvature of the central zone;

wherein the lens is determined based on target values for power and astigmatism for a given direction of glance in the central zone of the second face of the lens and an interpolation formula applied to the central and peripheral zones to define an interpolated surface comprising a connecting zone, the interpolated surface minimizing a merit function for different relative altitudes of the peripheral zone with respect to the central zone.

22. The visual device of claim 21, wherein the curvature is greater than or equal to 6D.

* * * * *

UNITED STATES PATENT AND TRADEMARK OFFICE
CERTIFICATE OF CORRECTION

| | |
|---|---|
| PATENT NO. | : 8,007,102 B2 |
| APPLICATION NO. | : 12/442840 |
| DATED | : August 30, 2011 |
| INVENTOR(S) | : De Gaudemaris et al. |

It is certified that error appears in the above-identified patent and that said Letters Patent is hereby corrected as shown below:

| | | |
|---|---|---|
| First Page Column 1 (Assignee) | Line 2 | Delete "d'Optique)," and insert -- D'Optique), --, therefor. |
| Column 7 | Line 12 (Approx.) | Delete "point" and insert -- point O --, therefor. |
| Column 10 | Line 55 | Delete "Sph'_ji" and insert -- Sph'_yi --, therefor. |
| Column 12 | Line 67 | Delete "ordinatee-axis." and insert -- ordinate-axis. --, therefor. |
| Column 17 | Line 65 | In Claim 1, delete "$D_{ini}$," and insert -- $D_{ini}$ --, therefor. |
| Column 17 | Line 67 | In Claim 1, delete "$D_{ini}$," and insert -- $D_{ini}$ --, therefor. |
| Column 19 | Line 1 | In Claim 14, delete "consist, over" and insert -- over --, therefor. |
| Column 19 | Line 2 | In Claim 14, delete "$D_{rac}$," and insert -- $D_{rac}$ --, therefor. |
| Column 20 | Line 9 | In Claim 19, delete "$D_{ini}$," and insert -- $D_{ini}$ --, therefor. |

Signed and Sealed this
Sixth Day of March, 2012

David J. Kappos
*Director of the United States Patent and Trademark Office*